(12) United States Patent
Sonoda et al.

(10) Patent No.: US 9,093,399 B2
(45) Date of Patent: Jul. 28, 2015

(54) ORGANIC ELECTROLUMINESCENCE DISPLAY DEVICE, METHOD FOR PRODUCING SAME, COLOR FILTER SUBSTRATE AND METHOD FOR PRODUCING SAME

(75) Inventors: Tohru Sonoda, Osaka (JP); Emi Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 978 days.

(21) Appl. No.: 13/259,420

(22) PCT Filed: Jan. 27, 2010

(86) PCT No.: PCT/JP2010/051049
§ 371 (c)(1),
(2), (4) Date: Sep. 23, 2011

(87) PCT Pub. No.: WO2010/137355
PCT Pub. Date: Dec. 2, 2010

(65) Prior Publication Data
US 2012/0012834 A1 Jan. 19, 2012

(30) Foreign Application Priority Data
May 28, 2009 (JP) .................. 2009-129516

(51) Int. Cl.
*H01L 27/32* (2006.01)
*H01L 51/56* (2006.01)
(Continued)

(52) U.S. Cl.
CPC ............ *H01L 27/3211* (2013.01); *G02B 5/201* (2013.01); *G02B 5/223* (2013.01); *H01L 27/3246* (2013.01); *H01L 27/3283* (2013.01); *H01L 51/0003* (2013.01)

(58) Field of Classification Search
CPC .... G02B 5/201; G02B 5/223; H01L 27/3211; H01L 27/3213; H01L 27/3216; H01L 27/3218; H01L 27/322; H01L 27/3246; H01L 27/3283; H01L 27/3295; H01L 51/0003

USPC ........ 313/110, 504; 349/106; 359/891; 430/7
See application file for complete search history.

(56) References Cited

U.S. PATENT DOCUMENTS 5,855,994 A * 1/1999 Biebuyck et al. ............. 428/209
2004/0140759 A1* 7/2004 Park et al. ..................... 313/504
(Continued)

FOREIGN PATENT DOCUMENTS

JP 2004207126 A * 7/2004
JP 2004-363107 A 12/2004
(Continued)

OTHER PUBLICATIONS

Machine Translation of JP 2004-207126A, retrieved Sep. 29, 2014.*
(Continued)

*Primary Examiner* — Anh Mai
*Assistant Examiner* — Steven Horikoshi
(74) *Attorney, Agent, or Firm* — Morrison & Foerster LLP

(57) ABSTRACT

An OLED comprising a substrate with a plurality of pixel regions of first to third colors disposed within a display area, and a functional material layer comprising an organic emissive layer disposed at each of the plurality of pixel regions, wherein first to third partition parts are disposed on the substrate within the display area, first to third frame-like structures are disposed on the substrate outside the display area, the pixel region of the first color is disposed within a first demarcation region demarcated by the first partition part, the pixel region of the second color is disposed within a second demarcation region demarcated by the second partition part, the pixel region of the third color is disposed within a third demarcation region demarcated by the third partition part, and the first to third demarcation regions are connected to the to the interior of the first to third frame-like structures, respectively.

17 Claims, 6 Drawing Sheets

(51) Int. Cl.
  *G02B 5/20* (2006.01)
  *H01L 51/00* (2006.01)
  *G02B 5/22* (2006.01)

(56) References Cited

U.S. PATENT DOCUMENTS

2004/0169462 A1 9/2004 Sasaki
2006/0145163 A1 7/2006 Tsujimura et al.
2007/0001592 A1 1/2007 Sasaki

FOREIGN PATENT DOCUMENTS

| | | |
|---|---|---|
| JP | 2007-333853 A | 12/2007 |
| WO | 03/022010 A1 | 3/2003 |
| WO | 2004/028216 A1 | 4/2004 |

OTHER PUBLICATIONS

International Search Report received for PCT Patent Application No. PCT/JP2010/051049, mailed on Mar. 2, 2010, 2 pages (1 page of English Translation and 1 page of PCT Search Report).

* cited by examiner

ORGANIC ELECTROLUMINESCENCE DISPLAY DEVICE, METHOD FOR PRODUCING SAME, COLOR FILTER SUBSTRATE AND METHOD FOR PRODUCING SAME

CROSS REFERENCE TO RELATED APPLICATIONS

This is a U.S. National Phase patent application of PCT/JP2010/051049, filed Jan. 27, 2010, which claims priority to Japanese Patent Application No. 2009-129516, filed May 28, 2009, each of which is hereby incorporated by reference in the present disclosure in its entirety.

TECHNICAL FIELD

The present invention relates to an organic electroluminescent display device, a manufacturing method thereof, a color filter substrate and a manufacturing method thereof. More specifically, the present invention relates to an organic electroluminescent display device appropriate for display devices in color displays, a manufacturing method thereof, a color filter substrate and a manufacturing method thereof.

BACKGROUND ART

Organic electroluminescent display devices (hereafter also referred to as organic EL display devices, or OLEDs) can be easily manufactured with thin profiles, have fast response times, and require no backlights, which is accordingly advantageous in terms of low power consumption. Organic electroluminescent display devices hold thus potential as display devices that can supersede liquid crystal display devices and CRTs (cathode ray tubes).

At present, red (R), green (G) and blue (B) pixels are separately applied, in organic EL display devices, by mask evaporation or ink-jet (IJ) methods. Specifically, as illustrated in FIG. 11, materials of functional material layers (organic functional layers) i.e. functional materials, are separately vapor-deposited for each pixel 300 of a respective color, by way of a slot mask, so as to cover each pixel 300 (pixel emissive section 310). As a result there are formed vapor deposition regions 320 that cover the pixels 300 of each color. If a slit mask is used, a stripe-like functional material is vapor-deposited for each pixel 300 of a respective color. If an ink-jet method is used, on the other hand, there is formed a bank that surrounds each pixel 300, and functional materials are applied within the banks. In this case, the coated regions within the banks correspond to the picture element emissive sections 310 in FIG. 11. Methods for forming coating-type R, G and B pixels using a solution such as those of ink-jet methods have attracted attention on account of the high material use efficiency that such methods afford. Ink-jet methods are used not only in the organic layers of the organic EL elements, but also to manufacture the color filter layers (colored layers) of color filter substrates, and functional thin films such as pattern wiring in metallic wiring substrates.

Instances where pixels of dissimilar colors (for instance, RGB) are formed by mask evaporation, however, involved significant technical problems in terms of the need for high-precision evaporation mask affixing technologies, as well as technologies for minimizing evaporation blur (technologies for clearly defining the boundaries between pixels of dissimilar colors). The increased mask weight that accompanies greater substrate sizes was also a problem.

On the other hand, formation of pixels of dissimilar colors using an ink-jet method involved significant technical problems in terms of the need for technologies for suppressing coating variability at each pixel, and the need for high-precision ink discharge technologies.

In conventional organic EL display devices it was thus difficult to form individual layers (films) for each R, G and B pixel. Therefore, major problems in terms of device, yield, cost and technology bedeviled the manufacture of high-definition organic EL display devices at a level of 300 ppi or greater, as currently afforded by liquid crystal display devices, and the manufacture of large organic EL display devices, at the 40-inch level. A demand existed thus for the development of simple and inexpensive methods for forming organic layers.

In this context, Patent Document 1 discloses, as a simple and inexpensive method of forming organic layers, a method for filling picture elements with an organic EL solution by capillarity. This method can also be used in high-resolution display devices. More specifically, separate R, G and B coating is accomplished by forming trenches for R, G and B pixels in such a manner that the leading ends of the respective trenches are at staggered positions, and by providing a stopper (photoresist) that hinders intrusion of organic EL solution, at the trenches for R and G pixels. Specifically, the method involves filling a B organic EL solution into a B pixel trench having the highest leading end; stripping next the stopper provided in the G pixel trench; filling next a G organic EL solution into the G pixel trench while preventing the G organic EL solution from coming into contact with the leading end of the B pixel trench; stripping next the stopper provided in the R pixel trench; and filling lastly an R organic EL solution into the R pixel trench.

Patent Documents 2 and 3 as well disclose methods for manufacturing organic EL display devices by capillarity. Patent Document 2 discloses a method for manufacturing an organic EL display device in which a trench (groove) formed in a photoresist is filled, by capillarity, with a dopant material. Patent Document 3 discloses a film formation method that involves forming an injection trench, which communicates with an opening at which a picture element is disposed, in a dielectric layer; and injecting a liquid, for instance an emissive layer material, into the injection trench, to cause thereby the liquid to flow, by capillarity, from the injection trench into the picture element. The methods of Patent Documents 2 and 3 enable separate coating, by capillarity, of pixels of at most two colors.

PRIOR ART REFERENCES

Patent Documents

Patent Document 1: WO 2003/022010
Patent Document 2: WO 2004/028216
Patent Document 3: JP 2004-363107 A In the technology disclosed in Patent Document 1, substrate is immersed in a tank where an organic EL solution is stored, and hence a large amount of organic EL solution is required for filling the pixels with organic EL solution. Also, re-dissolution of a previously formed organic EL layer upon immersion of the substrate in the tank may give rise to turbidity in an organic EL solution that is used subsequently. Moreover, portions of the substrate at which no organic EL layer is formed are also immersed in an organic EL solution; this results in substrate contamination. The resist stripping process must be performed twice during the formation of the organic EL layers. This makes for a complex manufacturing process, and results in impairment of the organic EL layer characteristics.

The methods of Patent Documents 2 and 3 enable separate coating, by capillarity, of pixels of at most two colors. Ordinarily, picture elements in display devices for color display are made up of pixels of three colors (for instance, RGB). Therefore, the methods in Patent Documents 2 and 3 left room for improvement in that at least pixels of one color had to be formed by mask evaporation or the like.

Therefore, a demand still existed for a method for manufacturing organic EL display devices inexpensively and easily while suppressing characteristic impairment.

Ink-jet devices and discharge heads having high-precision discharge positioning capability were required for all colors in cases where there is used an ink-jet method for separate coating of colored layers of all colors (for instance, R, G and B) in a color filter substrate for high-definition liquid crystal display devices having a resolution level of 300 ppi or higher. The coating time was longer in such a case, which resulted in lower throughput (processing capacity per unit time).

DISCLOSURE OF THE INVENTION

In the light of the above, it is an object of the present invention to provide an organic EL display device, and a color filter substrate, that can be manufactured inexpensively and easily and that allow reducing the size of pixel regions, and to provide a manufacturing method of the organic EL display device and a manufacturing method of the color filter substrate.

As a result of various studies performed by the inventors on organic EL display devices that can be manufactured inexpensively and easily and that allows reducing the size of pixel regions, the inventors came to focus on methods in which a coating liquid that is injected into frame-like structures that are formed outside a display area is made to flow into pixel regions within the display area by exploiting the flow of coating liquid that occurs due to capillarity and the like. The inventors found that pixel regions of three or more colors could be separately coated by forming at least three frame-like structures outside a display area and by using the above-mentioned method, so that it was possible to form pixel regions of all the colors that make up a picture element inexpensively and easily. The inventors found that the above problems could be admirably solved thereby, and arrived thus at the present invention.

Specifically, the present invention is an organic EL display device comprising a substrate in which a plurality of pixel regions, including a pixel region of a first color, a pixel region of a second color and a pixel region of a third color, is disposed within a display area, and a functional material layer comprising an organic emissive layer being disposed at each of the plurality of pixel regions, wherein a first partition part, a second partition part and a third partition part are disposed on the substrate within the display area; a first frame-like structure, a second frame-like structure and a third frame-like structure are disposed on the substrate outside the display area; the pixel region of the first color is disposed within a first demarcation region demarcated by the first partition part; the pixel region of the second color is disposed within a second demarcation region demarcated by the second partition part; the pixel region of the third color is disposed within a third demarcation region demarcated by the third partition part; the first demarcation region is connected to an interior of the first frame-like structure; the second demarcation region is connected to an interior of the second frame-like structure; and the third demarcation region is connected to an interior of the third frame-like structure.

So long as such constituent elements are formed as essential elements, the configuration of the organic EL display device of the present invention is not particularly limited as regards other constituent elements.

Preferred forms of the organic EL display device of the present invention are explained in detail further on.

In a plan view of the substrate, preferably, the first frame-like structure and the second frame-like structure are oppositely disposed across the display area; and the third frame-like structure is disposed at a region flanked by the first frame-like structure and the second frame-like structure. Thus, the first, second and third frame-like structures are disposed in the form of a C-shape so as to surround the display area in three directions. As a result, dissimilar coating liquids can easily flow into the first, second and third demarcation regions in an easy manner. Pixel regions of three colors can be separately coated in an easy manner thereby.

In a plan view of the substrate, preferably, two of the third frame-like structures are oppositely disposed across the display area. As a result, the third demarcation region can be filled with the coating liquid in a short time.

In a plan view of the substrate, preferably, the third demarcation region includes a U-like shape along a contour line of either the first demarcation region or the second demarcation region. Ordinarily, a plurality of pixel regions of dissimilar colors is disposed in the row and column directions, in the display area. In a case, for instance, where picture elements have an RGB configuration, columns made up of a plurality of R pixel regions, columns made up of a plurality of G pixel regions and columns made up of a plurality of B pixel regions are disposed side by side. In such a configuration, it was difficult to coat separately pixel regions of three or more colors using a method in which a coating liquid flows into straight trenches, as disclosed in Patent Documents 1 to 3. Herein, by contrast, the third demarcation region includes a U-like shape, as a result of which the coating liquid that is injected into the third demarcation region can spread wrapping around a region demarcated by other partition parts. As a result, pixel regions of three colors can be separately coated in an easy manner.

The pixel regions that can be separately coated in the organic EL display device of the present invention are not limited to three colors. Pixel regions of four or more colors can also be separately coated by adding further frame-like structures and partition parts. In such a case, for instance, the region demarcated by an additional partition part need just include a U-like shape along the third demarcation region. The position at which the additional frame-like structure is disposed is not particularly limited, and may be appropriately set in accordance with the members that are disposed outside the display area.

One preferred configuration in an instance where a third demarcation region such as the above-described one includes a U-like shape, may be, for instance, a configuration wherein, in a plan view of the substrate, a plurality of the pixel regions is oppositely disposed within the third demarcation region so as to flank the either the first demarcation region or the second demarcation region.

One preferred configuration in an instance where a third demarcation region such as the above-described one includes a U-like shape, may be, for instance, a configuration wherein, in a plan view of the substrate, the pixel region is disposed within the third demarcation region, so as not to flank the first demarcation region and the second demarcation region.

Preferably, in a plan view of the substrate, a plurality of the first demarcation regions and a plurality of the second demarcation regions are alternately juxtaposed on the substrate, and the third demarcation region has a meandering shape along a contour line of the first demarcation region and a contour line of the second demarcation region. As a result, the third demarcation region can be disposed, in the form of an integral shape, between the first demarcation region and the second demarcation region. Pixel regions of three colors can be separately coated in an easy manner thereby, even when, for instance, the first demarcation region, the second demarcation region and the third demarcation region are disposed in the form of stripes.

Preferably, a pair of electrodes that sandwich the functional material layer, and an edge cover that covers an end portion of one of the pair of electrodes, are disposed on the substrate, such that at least one of the first partition part, the second partition part and the third partition part is disposed on the edge cover. As a result, the effect of the present invention can be brought out while preventing shorts between electrodes in the pair of electrodes.

Preferably, the substrate is a TFT substrate.

Preferably, a plurality of picture elements, each including the pixel region of the first color, the pixel region of the second color and the pixel region of the third color, is juxtaposed in row and column directions within the display area; and two pixel regions of at least one color, from among the pixel region of the first color, the pixel region of the second color and the pixel region of the third color, are disposed in one picture element.

Preferably, a plurality of picture elements, each including the pixel region of the first color, the pixel region of the second color and the pixel region of the third color, is juxtaposed in row and column directions within the display area; and the pixel region of the first color, the pixel region of the second color and the pixel region of the third color are disposed point-symmetrically in picture elements that are adjacent in the row direction.

Preferably, a material of the functional material layer disposed at the pixel region of the first color is disposed within the first frame-like structure; a material of the functional material layer disposed at the pixel region of the second color is disposed within the second frame-like structure; and a material of the functional material layer disposed at the pixel region of the third color is disposed within the third frame-like structure.

Preferably, a material of the organic emissive layer disposed at the pixel region of the first color is disposed within the first frame-like structure; a material of the organic emissive layer disposed at the pixel region of the second color is disposed within the second frame-like structure; and a material of the organic emissive layer disposed at the pixel region of the third color is disposed within the third frame-like structure.

The present invention is also an organic EL display device manufacturing method being a method for manufacturing the organic EL display device of the present invention (also referred to hereafter as first organic EL display device manufacturing method of the present invention), the manufacturing method comprising the steps of injecting a first coating liquid, containing a material of the functional material layer that is disposed at the pixel region of the first color, into the first frame-like structure; injecting a second coating liquid, containing a material of the functional material layer that is disposed at the pixel region of the second color, into the second frame-like structure; and injecting a third coating liquid, containing a material of the functional material layer that is disposed at the pixel region of the third color, into the third frame-like structure. The first demarcation region is connected to the interior of the first frame-like structure, and hence the coating liquid injected into the first frame-like structure flows into the first demarcation region and fills the pixel region of the first color disposed within the first demarcation region. The same is true of the second and the third frame-like structures. Therefore, the present invention allows injecting dissimilar coating liquids into the first, second and third demarcation regions, and allows coating separately pixel regions of three colors in an easy manner. The pixel regions of all the colors that make up the picture elements can be formed without using an evaporation mask.

The first organic EL display device manufacturing method of the present invention is not particularly limited as regards other steps, so long as the method comprises the aforementioned steps.

Preferred aspects of the first organic EL display device of the present invention are explained further on.

Preferably, a viscosity of the third coating liquid is lower than those of the first coating liquid and of the second coating liquid. As a result, the region demarcated by the third partition part can be filled with coating liquid in a short time. As described above, filling of the coating liquid into the pixel region of the third color disposed in the third demarcation region may take a long time in a configuration where the third demarcation region includes a U-like shape or in a configuration where the third demarcation region has a meandering shape. The above feature is particularly effective in such aspects.

The organic EL display device manufacturing method comprises preferably a step of forming simultaneously the first partition part, the second partition part, the third partition part, the first frame-like structure, the second frame-like structure and the third frame-like structure. This allows further simplifying the manufacturing process of the organic EL display device.

The present invention is also an organic EL display device manufacturing method (hereafter also referred to as second organic EL display device manufacturing method of the present invention) being a method for manufacturing an organic EL display device that comprises a substrate in which a plurality of pixel regions, including a pixel region of a first color, a pixel region of a second color and a pixel region of a third color, is disposed within a display area, and a functional material layer comprising an organic emissive layer being disposed at each of the plurality of pixel regions, wherein the method comprises the steps of forming, on the substrate within the display area, a first partition part that demarcates the pixel region of the first color, a second partition part that demarcates the pixel region of the second color and a third partition part that demarcates the pixel region of the third color; forming, on the substrate outside the display area, a first frame-like structure whose interior is connected to a first demarcation region demarcated by the first partition part, a second frame-like structure whose interior is connected to a second demarcation region demarcated by the second partition part, and a third frame-like structure whose interior is connected to a third demarcation region demarcated by the third partition part; injecting a first coating liquid, containing a material of the functional material layer that is disposed at the pixel region of the first color, into the first frame-like structure; injecting a second coating liquid, containing a material of the functional material layer that is disposed at the pixel region of the second color, into the second frame-like structure; and injecting a third coating liquid, containing a material of the functional material layer that is disposed at the pixel region of the third color, into the third frame-like structure. Effects identical to those of the first organic EL display device manufacturing method of the present invention are can be elicited as a result.

The second organic EL display device manufacturing method of the present invention is not particularly limited as regards other steps, so long as the method comprises the aforementioned steps.

Also, the above-described preferred aspect of the first organic EL display device manufacturing method of the present invention can be used as a preferred aspect of the second organic EL display device manufacturing method of the present invention.

The present invention is also a color filter substrate comprising a substrate in which a plurality of colored layers, including a colored layer of a first color, a colored layer of a second color and a colored layer of a third color, is disposed within a display area; wherein a first partition part, a second partition part and a third partition part are disposed on the substrate within the display area; a first frame-like structure, a second frame-like structure and a third frame-like structure are disposed on the substrate outside the display area; the colored layer of the first color is disposed within a first demarcation region demarcated by the first partition part; the colored layer of the second color is disposed within a second demarcation region demarcated by the second partition part; the colored layer of the third color is disposed within a third demarcation region demarcated by the third partition part; the first demarcation region is connected to an interior of the first frame-like structure; the second demarcation region is connected to an interior of the second frame-like structure; and the third demarcation region is connected to an interior of the third frame-like structure. As a result there can be realized a color filter substrate amenable to high-definition and that can be manufactured inexpensively and easily.

So long as such constituent elements are formed as essential elements, the configuration of the color filter substrate of the present invention is not particularly limited as regards other constituent elements.

The above-described preferred form of the organic EL display device of the present invention can also be used as a preferred form of the color filter substrate of the present invention by replacing the feature "pixel region" by "colored layer".

The present invention is also a color filter substrate manufacturing method being a method for manufacturing a color filter substrate that comprises a substrate in which a plurality of colored layers, including a colored layer of a first color, a colored layer of a second color and a colored layer of a third color, is disposed within a display area, the manufacturing method comprising the steps of forming, on the substrate within the display area, a first partition part that demarcates the colored layer of the first color, a second partition part that demarcates the colored layer of the second color and a third partition part that demarcates the colored layer of the third color; forming, on the substrate outside the display area, a first frame-like structure whose interior is connected to a first demarcation region demarcated by the first partition part, a second frame-like structure whose interior is connected to a second demarcation region demarcated by the second partition part, and a third frame-like structure whose interior is connected to a third demarcation region demarcated by the third partition part; injecting a first coating liquid, containing a material of the colored layer of the first color, into the first frame-like structure; injecting a second coating liquid, containing a material of the colored layer of the second color, into the second frame-like structure; and injecting a third coating liquid, containing a material of the colored layer of the third color, into the third frame-like structure. As a result, colored layers of three colors can be separately coated in an easy manner by exploiting the flow of coating liquid that occurs due to capillarity and the like.

The color filter substrate manufacturing method of the present invention is not particularly limited as regards other steps, so long as the method comprises the aforementioned steps.

The above-described preferred aspect of the first organic EL display device manufacturing method of the present invention can be used as a preferred aspect of the color filter substrate manufacturing method of the present invention by replacing the feature "pixel region" by "colored layer".

The above aspects and forms can be suitably combined with each other without departing from the scope of the present invention.

Effect of the Invention

By virtue of the organic EL display device of the present invention, manufacturing method thereof, color filter substrate of the present invention and manufacturing method thereof, there can be provided an organic EL display device, and a color filter substrate, that can be manufactured inexpensively and easily and that allow reducing the size of pixel regions, and there can be provided a manufacturing method of the organic EL display device and a manufacturing method of the color filter substrate.

MODES FOR CARRYING OUT THE INVENTION

In the present description, taper angle denotes an angle with respect to the surface of a substrate. A shape having a taper angle of 90° or less is referred to as a forward taper shape, and a shape having a taper angle in excess of 90° is referred to as a reverse taper shape.

In the present example, red denotes preferably a color having a dominant wavelength ranging from 620 nm to 680 nm, more preferably a color having a dominant wavelength ranging from 630 nm to 670 nm. Green denotes preferably a color having a dominant wavelength ranging from 520 nm to less than 580 nm, more preferably a color having a dominant wavelength ranging from 530 nm to 570 nm. Blue denotes preferably a color having a dominant wavelength ranging from 420 nm to less than 480 nm, more preferably a color having a dominant wavelength ranging from 430 nm to 470 nm.

The present invention will be explained in more detail based on embodiments with reference to accompanying drawings. However, the present invention is not limited to these embodiments alone.

Embodiment 1

Figure 4:
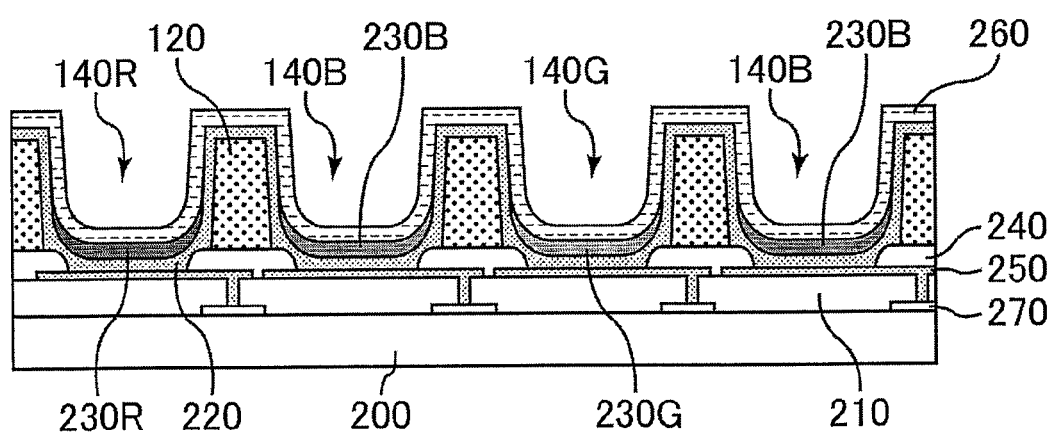
FIG. 4 is a cross-sectional schematic diagram of FIG. 3 along line A1-A2, and is also a cross-sectional schematic diagram illustrating the organic EL display device of Embodiment 1.

FIG. 4 is a cross-sectional schematic diagram illustrating an organic EL display device of Embodiment 1. As illustrated in FIG. 4, the organic EL display device (organic EL display), of the present embodiment has a structure in which a substrate 200 has stacked thereon, in this order from the substrate 200, a first electrode 250, an edge cover 240, a partition 120, a functional material layer and a second electrode 260. The first electrode 250 is provided at each of a pixel region 140R(R pixel region), a pixel region 140G (G pixel region) and a pixel region 140B (B pixel region). The edge cover 240 is a member for covering an end portion of the first electrode 250. The partition 120 is a member for separating the pixel regions 140R, 140G, 140B and for holding a coating liquid (solution). The partition 120 is insulating. The functional material layer includes an emissive layer (also referred to as an organic emissive layer) that contains an organic compound. In FIG. 4, organic emissive layers 230R, 230G, 230B and a hole-injection layer-cum-hole-transport layer 220 correspond to the functional material layer. One from among the first electrode 250 and the second electrode 260 and functions as an anode and the other functions as a cathode.

The substrate 200 may be an active matrix substrate, or a passive matrix substrate. FIG. 4 illustrates an instance where the substrate 200 is an active matrix substrate. In the case of an active matrix substrate, the substrate 200 has sequentially formed thereon, in this order, a plurality of thin film transistors (TFTs) 270 and a plurality of signal lines, and on top thereof, an interlayer dielectric 210 that functions as a planarizing layer and a first electrode 250. In the case of a passive matrix substrate, the substrate has formed thereon a plurality of signal lines and the first electrode 250.

On the active matrix substrate, the organic EL element portion and the active element portion, such as the TFTs 270, are isolated from each other by an interlayer dielectric 210. The active element portion disposed at a lower layer and the first electrode 250 disposed at a higher layer are electrically connected to each other by way of conductors for connection that run through contact holes that are drilled in the interlayer dielectric 210. The active element portion and the organic EL element portion are electrically connected thereby. The first electrode 250 may be used as the conductor for connection.

The abovementioned functional material layer may be formed out of a low-molecular material, or out of a polymer material.

The abovementioned functional material layer may have, for instance, the below-described build-ups, but the present invention is not limited thereto. Herein, a carrier transport layer denotes a hole-transport layer or an electron-transport layer. An electron blocking layer is a type of carrier blocking layer. In the present invention (the present description) all the layers sandwiched between a pair of electrodes (first electrode 250 and second electrode 260) will be collectively referred to as functional material layers:

(1) Hole-transport layer/organic emissive layer
(2) Organic emissive layer/electron-transport layer
(3) Hole-transport layer/organic emissive layer/electron-transport layer
(4) Hole-injection layer/hole-transport layer/organic emissive layer/electron-transport layer
(5) Hole-transport layer/electron blocking layer/organic emissive layer/electron-transport layer The organic emissive layers 230R, 230G, 230B may each be one layer, or may each have a structure in which plurality of layers are stacked. The layers may result from doping a host material with a dopant.

An explanation follows next on a coating liquid that is used in a process of filling the pixel regions 140R, 140G, 140B with an organic luminescent material (hereafter, simply luminescent material) by exploiting the flow of a coating liquid that occurs due to capillarity and the like. An instance is explained herein in which a polymeric organic luminescent material is used as the coating liquid, but the present invention is not limited thereto in any way, and, needless to say, there may be used a soluble low-molecular organic luminescent material. In the present embodiment there just need be provided at least one functional material layer formed by a method that involves filling a region partitioned by the partition 120 with a coating liquid that comprises an organic luminescent material, by exploiting the flow of coating liquid that occurs due to capillarity and the like. Thus, other functional material layers formed in accordance with other methods may also be present. In the build-up (4) above, for instance, there may be used an inorganic material as the material of the hole-transport layer, a hole-transport layer may be formed on the substrate 200, by sputtering or vacuum evaporation, so that the organic emissive layers 230R, 230G, 230B are formed thereafter on the hole-transport layer by exploiting the flow of coating liquid that occurs due to capillarity and the like, followed by formation of the electron-transport layer, through spraying, on the organic emissive layers 230R, 230G, 230B.

The organic emissive layers 230R, 230G, 230B are formed by filling (coating) the interior of regions demarcated by the partition 120 with a coating liquid that comprises a luminescent material, by exploiting the flow of coating liquid that occurs due to capillarity and the like. The coating liquids that are used are solutions that contain at least a luminescent material and a solvent. The luminescent material may be of single type or may be a plurality of types. The coating liquid may contain, for instance, a film holding material (binder), a leveling material, a luminescence assist material, an additive (donor, acceptor or the like), a carrier transport material or a luminescent dopant.

As the luminescent material there can be used an ordinary luminescent material for organic EL elements. Such luminescent materials can be classified into, for instance, polymeric luminescent materials and precursors of polymeric luminescent materials. Specific examples of such compounds are set forth below, but the present invention is not limited to these compounds.

Examples of the polymeric luminescent material include, for instance, poly(2-decyloxy-1,4-phenylene) (DO-PPP), poly[2,5-bis-[2-(N,N,N-triethylammonium)ethoxy]-1,4-phenyl-alt-1,4-phenylene]dibromide (PPP-NEt3+), poly[2-(2'-ethylhexyloxy)-5-methoxy-1,4-phenylenevinylene] (MEH-PPV) and the like.

Examples of the precursor of the polymeric luminescent material include, for instance, poly(p-phenylenevinylene) precursors (Pre-PPV), poly(p-naphthalenevinylene) precursors (Pre-PNV) and the like.

The solvent need only dissolve or disperse the luminescent material, and may be, for instance, pure water, methanol, ethanol, THF (tetrahydrofuran), chloroform, toluene, xylene, trimethylbenzene or the like. Preferably, however, the solvent is a high-boiling point solvent in order to increase the planarity of the films (organic emissive layers 230R, 230G, 230B) formed out of the coating liquids.

A low-molecular luminescent material may be used as the luminescent material. Examples of low-molecular luminescent materials include, for instance, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, as well as a tris(8-quinolinolato)aluminum complex, a bis(benzoquinolinolate)beryllium complex, a tri(dibenzoylmethyl)phenanthroline europium complex, ditolyl vinyl biphenyl and the like.

The hole-transport layer and the electron-transport layer (hereafter referred to collectively as carrier transport layers) may each have a single layer structure or a multilayer structure, and may be configured so that the carrier transport layer can double as an injection layer. The carrier transport layer can be formed in accordance with the same method as the organic emissive layers 230R, 230G, 230B, or may be formed in accordance with some other method.

An ordinary material can be used as the material of the carrier transport layer (carrier transport material). Specific examples of such compounds are set forth below, but the present invention is not limited to these compounds.

Examples of the material of the hole-transport layer (hole-transport material) include, for instance, porphyrin compounds, aromatic tertiary amine compounds such as N,N'-bis-(3-methylphenyl)-N,N'-bis-(phenyl)-benzidine (TPD) and N,N'-di(naphthalene-1-yl)-N,N'-diphenyl-benzidine (NPD); low-molecular materials, such as hydrazone compounds, quinacridone compounds, and styrylamine compounds; polymeric materials, such as polyaniline, 3,4-polyethylene dioxythiophene/polystyrenesulfonate (PEDOT/PSS), poly(triphenylamine) derivatives, and polyvinylcarbazole (PVCz); and precursors of polymeric materials, such as poly(p-phenylenevinylene) precursors and poly(p-naphthalenevinylene) precursors.

Examples of the material of the electron-transport layer (electron-transport material) include, for instance, low-molecular materials, such as oxadiazole derivatives, triazole derivatives, benzoquinone derivatives, naphthoquinone derivatives and fluorene derivatives; and polymeric materials such as poly(oxadiazole).

The carrier blocking layer may have a single-layer structure or a multilayer structure. The carrier blocking layer can be formed in accordance with the same method as the organic emissive layers 230R, 230G, 230B, or may be formed in accordance with some other method.

An ordinary material can be used as the material of the carrier blocking layer (carrier blocking material). Specific examples of such compounds are set forth below, but the present invention is not limited to these compounds.

Examples of the material of the electron blocking layer (electron blocking material) include, for instance, low-molecular materials such as N,N'-bis-(3-methylphenyl)-N,N'-bis-(phenyl)-benzidine (TPD), and polymeric materials such as polyvinylcarbazole (PVCz). Examples of the material of the positive hole blocking layer (positive hole blocking material) include, for instance, polymer materials such as oxadiazole derivatives.

The solvent used for forming functional material layers other than the organic emissive layers 230R, 230G, 230B may be the same solvent as used for forming the organic emissive layers 230R, 230G, 230B. However, if the material used as the hole-transport material is a material soluble in the solvent for luminescent material, in a case, for instance, where the organic emissive layers 230R, 230G, 230B are stacked on the hole-transport material using a solution containing a luminescent material, then the hole-transport layer dissolves in the solvent for the luminescent material during the process of forming the emissive layer. This may impair the film homogeneity of the hole-transport layer. In the case of a stack of a plurality of functional material layers, therefore, it is preferable to use a solvent that does not dissolve underlying layers (layers formed previously) during formation of an overlying layer (layer formed subsequently).

An ordinary electrode material can be used in the first electrode 250 and the second electrode 260 (hereafter collectively referred to as electrode layers). A film such as a carrier injection layer can be inserted, as the case may require, at the interface between the electrode layer and the functional material layer.

As the anode (electrode that supplies positive holes to the functional material layer) there can be used a single-layer film comprising a metallic material having a large work function (for instance, Au, Ni, Pt or the like) or a conductive metal oxide (ITO, IZO, ZnO, $SnO_2$ or the like), or a multilayer film in which there are stacked a plurality of materials from among the foregoing materials. Also, an oxide having a thickness (for instance, about 1 nm) such that conductivity is not significantly impaired may be disposed between the anode and the functional material layer.

As the cathode (electrode that supplies electrons to a functional material layer) there can be used a metallic material having a work function no greater than 4.0 eV, such as Ca, Ce, Cs, Rb, Sr, Ba, Mg and Li (hereafter, low-work function material). Among the foregoing Ca and Ba are preferred in a polymer organic emissive layer. In terms of inhibiting degradation of the low-work function material by oxygen, water or the like, an alloy of a metal that is comparatively stable chemically, for instance Ni, Os, Pt, Pd, Al, Au, Rh or Ag, and the foregoing low-work function materials, is preferably used as the material of the cathode. In top-emission organic EL display devices the cathode must be thin, in order for the latter to be translucent. In top emission organic EL display devices, therefore, it is preferable to form a conductive metal oxide such as ITO, IZO, ZnO or $SnO_2$, as a transparent electrode layer, on a light-transmitting metallic layer (cathode), in order to secure sufficient conductivity in the cathode as an electrode. The transparent electrode layer may be a single layer, or a multilayer film of a plurality of materials.

The structure of the organic EL element portion in the present embodiment need only have at least the first electrode 250, an organic layer (functional material layer) including an emissive layer, and the second electrode 260, and may further comprise other layers, for instance the above-described oxide layer.

Example 1

Example 1 of the present invention will be explained next in detail with reference to accompanying drawings.

The overall configuration of the organic EL display device 100 according to Example 1 of the present invention, as well as an outline of the manufacturing method thereof, will be explained first with reference to FIGS. 1 and 2.

On a substrate (TFT substrate 200) made of glass, resin or the like and having TFTs formed thereon, there are patterned an interlayer film (interlayer dielectric), an anode (first electrode) and an edge cover, in this order. A plurality of picture elements is disposed in the form of a matrix within a display area 150 at which image display takes place.

Figure 1:
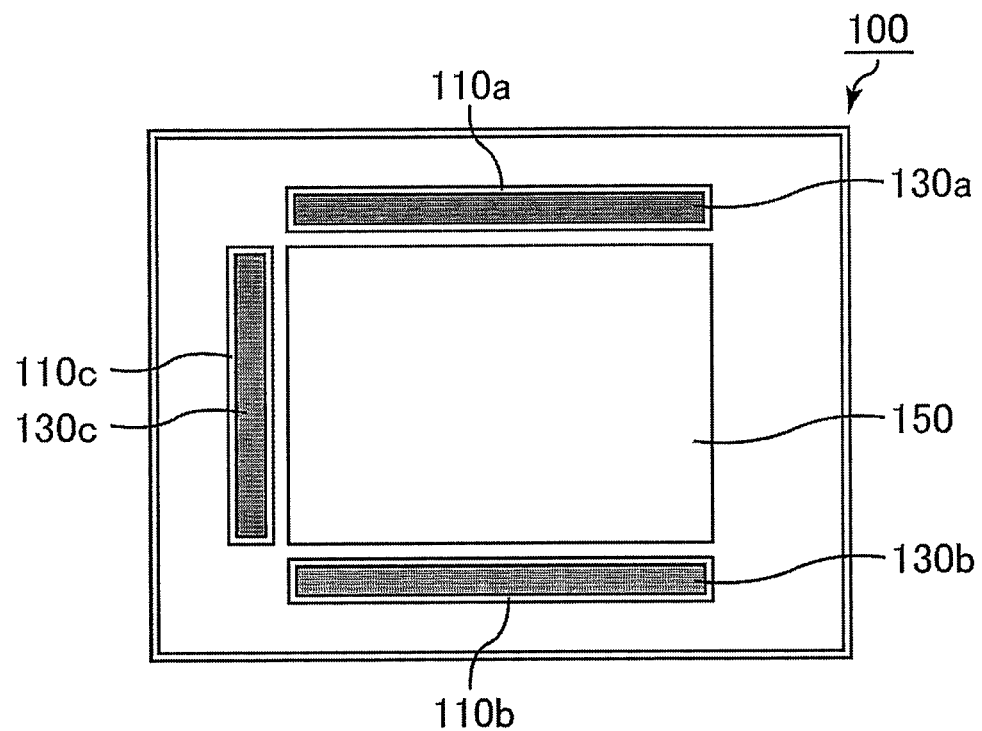
FIG. 1 is a plan-view schematic diagram illustrating the overall configuration of an organic EL display device of Example 1.
Figure 2:
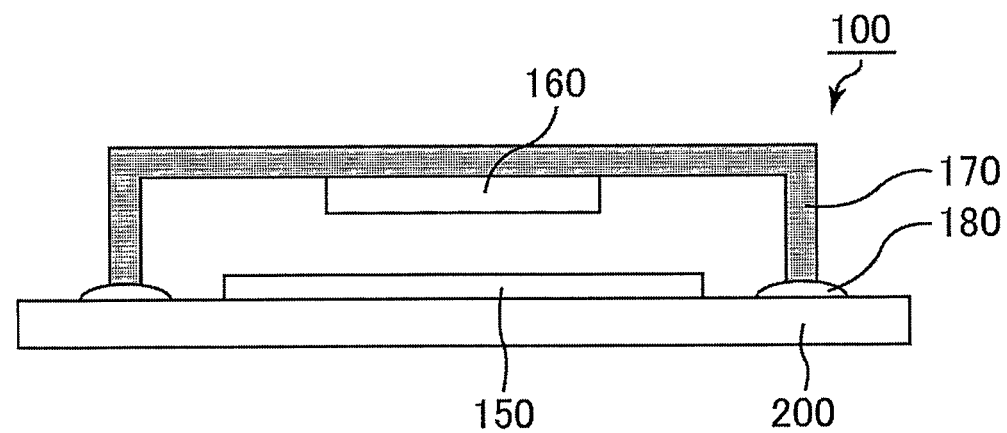
FIG. 2 is a cross-sectional schematic diagram illustrating the overall configuration of an organic EL display device of Example 1.

As illustrated in FIG. 1, frame-like structures 110a, 110b, 110c for retaining coating liquids (solutions) that contain functional materials of three colors, are formed by a permanent film resist (resist film that remains after completion the panel) outside the display area 150, i.e. at a frame area. At the same time, there are formed, within the display area 150, partitions for dividing pixel regions of dissimilar colors. As a result of this partitioning there is formed a plurality of stripe-like trenches (regions demarcated by a partition) within the display area 150.

Next, the functional material layers (hole-injection layer, hole-transport layer, interlayer and so forth) that are disposed below the emissive layer are formed over the entire surface of the display area 150. Vacuum evaporation, spraying or some other method is used herein. Alternatively, there may be used a method identical to that of the below-described method for producing emissive layers.

Next, coating liquids (filling liquids 130a, 130b, 130c) comprising luminescent materials of dissimilar colors are injected into the frame-like structures 110a, 110b, 110c. As a result, the coating liquids flow, on account capillarity, from the interior of the frame-like structures 110a, 110b, 110c into the trenches formed in the display area 150, whereby the trenches become filled with different coating liquids for each color of the pixel regions. The pixel regions can thus be separately coated with three colors. The method for injecting the coating liquids into the frame-like structures 110a, 110b, 110c may be an ink-jet method, a spray method, a nozzle coating method, or a method that involves using a dispenser.

The functional material layers (electron-transport layer, electron injection layer and so forth) disposed above the emissive layer are formed next in accordance with the same method as that of the functional material layers that are disposed below the emissive layer.

A cathode (second electrode) is formed next by vacuum evaporation. As illustrated in FIG. 2, a sealing glass 170 to which a desiccant 160 is affixed is bonded to the TFT substrate 200, and the whole is sealed using a sealing resin (sealing material) 180.

The organic EL display device 100 of the present example becomes completed as a result of the above-described procedure.

Figure 3:
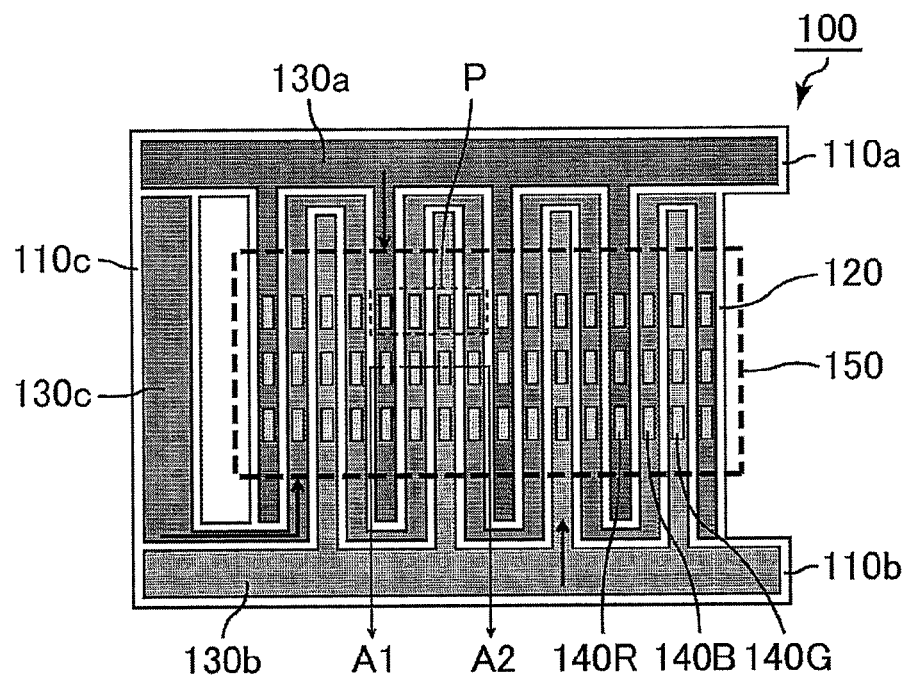
FIG. 3 is a plan-view schematic diagram illustrating the periphery of a display area of the organic EL display device of Example 1, and is also a plan-view schematic diagram illustrating the periphery of the display area of a color filter substrate of Example 6.

An explanation follows next, with reference to FIGS. 3 and 4, on the configuration and manufacturing method of the organic EL display device 100 according to Example 1 of the present invention.

As illustrated in FIG. 3, a plurality of picture elements is disposed, in the form of a matrix, on the display area 150 of the organic EL display device 100. The picture elements (pixels) are the smallest display units of the image. A pixel region is a single-color region that makes up a picture element. In FIG. 3, the region designated as P denotes one picture element. Each picture element comprises three colors, red (R), green (G) and blue (B). In one picture element there are disposed one pixel region 140R(R pixel region), one pixel region 140G (G pixel region) and two pixel regions 140B (B pixel region). The configuration of the picture elements in the present example is thus R/B/G/B.

The pixel region 140R, the pixel region 140G and the pixel regions 140B are disposed in the form of a matrix within the display area 150. Outside the display area 150 (frame region) there are disposed a frame-like structure 110a (first frame-like structure), a frame-like structure 110b (second frame-like structure) and a frame-like structure 110c (third frame-like structure).

As illustrated in FIG. 4, the TFTs 270, the first electrode 250 and the edge cover 240 are formed, on the TFT substrate 200, for each of the pixel regions 140R, 140G, 140B. The edge cover 240 is a member for covering an end portion of the first electrode 250 and preventing shorting between the end portion of the first electrode 250 and the second electrode 260.

On the edge cover 240 there is formed the insulating partition 120 that partitions (separates) the pixel regions 140R, 140G, 140B for each color. As illustrated in FIG. 3, the partition 120 is disposed so as to surround, in the vertical direction, adjacent same-color pixel regions. In a plan-view of the display area 150, the regions surrounded by the partition 120 exhibit a band-like (line-like) shape. That is, band-like trenches are formed, within the display area 150, by the partition 120, such that same-color pixel regions that are adjacent in the vertical direction are disposed within respective trenches.

A functional material layer is formed on the first electrode 250. More specifically, the hole-injection layer-cum-hole-transport layer 220 and the organic emissive layer 230R(R organic emissive layer) are formed in this order in the pixel region 140R. The hole-injection layer-cum-hole-transport layer 220 and the organic emissive layer 230G (G organic emissive layer) are formed in this order in the pixel region 140R. The hole-injection layer-cum-hole-transport layer 220 and the organic emissive layer 230B (B organic emissive layer) are formed in this order in the pixel region 140B. The second electrode 260 is formed so as to cover the entirety of the display area 150.

The structures of the partition 120 and the frame-like structures 110a, 110b, 110c are explained in more detail next. The partition 120 that demarcates the pixel regions 140R, 140G, 140B is a wall-like structure that is formed, slit-like, along the array of pixel regions 140R, 140G, 140B that are disposed in the form of stripes. The partition 120 has a first partition part that demarcates the pixel region 140R from pixel regions of other colors, a second partition part that demarcates the pixel region 140G from pixel regions of other colors, and a third partition part that demarcates the pixel regions 140B from pixel regions of other colors. Each partition part functions as part of a partition part that demarcates a pixel region of an adjacent color, for instance, the first partition part and the second partition part demarcate also the pixel regions 140B, and hence the first partition part and the second partition part function also as part of the third partition part. Thus, the region demarcated by the third partition part may be referred to as a region demarcated by the first partition part and the second partition part.

The frame-like structure 110a is disposed along the upper contour line of the display area 150, i.e. along the upper end portion of the TFT substrate 200. The frame-like structure 110*b* is disposed along the lower contour line of the display area 150, i.e. along the lower end portion of the TFT substrate 200. The frame-like structures 110*a*, 110*b* are thus disposed opposing each other across the display area 150.

The frame-like structure 110*c* is disposed along the left contour line of the display area 150, i.e. along the left end portion of the TFT substrate 200. Thus, the frame-like structure 110*c* is disposed at a region flanked by the frame-like structures 110*a*, 110*b*, in a plan-view of the substrate, such that the display area 150 is surrounded on three sides by the frame-like structures 110*a*, 110*b*, 110*c*.

The frame-like structures 110*a*, 110*b*, 110*c* are provided in the form of frames in such a manner so as to surround a rectangular region that extends in the left-right direction. A plurality of openings is provided in the frame-like structures 110*a*, 110*b* on the side of the display area 150. One opening is provided in the frame-like structure 110*c* on the side of the display area 150.

The first partition part is connected to the frame-like structure 110*a*. That is, the first partition part and the frame-like structure 110*a* are formed integrally, such that the region demarcated by the first partition part (trench in which there is disposed the pixel region 140R adjacent in the vertical direction, first demarcation region) is connected to the interior of the frame-like structure 110*a*. Similarly, the second partition part is connected to the frame-like structure 110*b*. That is, the second partition part and the frame-like structure 110*b* are formed integrally. The region demarcated by the second partition part (trench in which there is disposed the picture element region 140G adjacent in the vertical direction, second demarcation region) is connected to the interior of the frame-like structure 110*b*. The third partition part is connected to the frame-like structure 110*c* formed outside the display area 150. That is, the third partition part and the frame-like structure 110*c* are formed integrally, such that the region demarcated by the third partition part (trench in which there are disposed the pixel regions 140B adjacent in the vertical direction, third demarcation region) is connected to the interior of the frame-like structure 110*c*.

In a case where a coating liquid (first coating liquid) containing an R luminescent material is applied in the frame-like structure 110*a*, the coating liquid spreads within the frame-like structure 110*a* and, on account of capillarity, gets through the openings of the frame-like structure 110*a* and spreads into the first demarcation region, wetting the latter. As a result, the pixel region 140R becomes coated with the coating liquid that comprises the R luminescent material. In a case where a coating liquid (second coating liquid) containing a G luminescent material is applied in the frame-like structure 110*b*, similarly, the coating liquid spreads within the frame-like structure 110*b* and, on account of capillarity, gets through the openings of the frame-like structure 110*b* and spreads into the second demarcation region, wetting the latter. As a result, the pixel region 140G becomes coated with the coating liquid that comprises the G luminescent material. In a case where a coating liquid (third coating liquid) containing a B luminescent material is applied in the frame-like structure 110*c*, the coating liquid spreads within the frame-like structure 110*c* and, on account of capillarity, gets through the opening of the frame-like structure 110*c* and spreads into the third demarcation region, wetting the latter. As a result, the pixel regions 140B become coated with the coating liquid that comprises the B luminescent material. In the present example, thus, all the color pixel regions that make up a picture element are separately coated by exploiting the phenomenon of capillarity.

The coating liquids that are injected into each respective frame-like structure spread, on account of capillarity, within the region demarcated by a respective partition part. As a result, the coating amount is equalized among pixel regions of a same color. This allows suppressing variability in the thickness of the films formed by the coating liquid, between pixel regions of a same color.

In the present example, thus, the frame-like structures 110*a*, 110*b* are formed along two opposing sides of the display area 150, such that pixel regions of two colors can be separately coated through alternate extension of the trenches into the display area 150, from the frame-like structures 110*a*, 110*b*.

By contrast, the frame-like structure 110*c* is formed along a side of the display area 150 that is perpendicular to a side that opposes either of the frame-like structures 110*a*, 110*b*, such that the pixel region of the remaining one color is coated through extension of the meandering trench towards the display area 150.

A method for manufacturing the organic EL display device 100 according to Example 1 of the present invention will be explained next.

Firstly, a photosensitive resin such as an acrylic resin or the like was coated, to a thickness of about 2 µm, onto the TFT substrate 200 in which TFTs 270, produced out of an amorphous silicon film or a polycrystalline silicon film, were formed as a matrix. This was followed by exposure, development and baking, to form thereby the interlayer dielectric 210. Next, an ITO film was formed by sputtering, to a film thickness of 100 nm, on the interlayer dielectric 210.

Next, the ITO film was patterned by photolithography using a ferric chloride aqueous solution as an etchant, to form the first electrode 250 delimited for each of the pixel regions 140R, 140G, 140B. The first electrode 250, which functions as an anode, is isolated from thin film transistors (TFTs 270) by the interlayer dielectric 210 functioning as a planarizing layer. The first electrode 250 is connected to respective thin film transistors 270 that are formed, in the form of a matrix, below the first electrode 250, by way of contact holes drilled in the interlayer dielectric 210.

Next, a photosensitive acrylic resin was spin-coated, to a thickness of about 1 µm, on the TFT substrate 200 having the first electrode 250 formed thereon. This was followed by exposure, development and baking, to form the edge cover 240. The edge cover 240 was formed so as to cover the end portion of the first electrode 250. The material of the edge cover 240 is not particularly limited, so long as it is an insulating material. Other than a photosensitive acrylic resin, there may be used also, for instance, a photosensitive polyimide resin, a photosensitive novolac resin or the like. One example of a photosensitive acrylic resin is, for instance, the Optomer series by JSR Corp., while an example of a photosensitive polyimide resin is, for instance, the Photoneece series by Toray.

Next, a dry film of the photosensitive resin was thermo-compression-bonded to the TFT substrate 200, followed by exposure, development and baking, to form the partition 120 on the edge cover 240, and to form the frame-like structures 110*a*, 110*b*, 110*c* integrally with the partition 120. Thus, the partition 120 and the frame-like structures 110*a*, 110*b*, 110*c* can be formed in a same process (simultaneously), which allows simplifying the manufacturing process. The thickness (height) of the partition 120 and of the frame-like structures 110*a*, 110*b*, 110*c* was set to 20 µm. One example of a dry film of a photosensitive resin is, for instance, the SU-8 series by Kayaku Microchem Corporation. As a result, the partition 120 was formed so as to surround the pixel regions 140R, 140G, 140B for each color. The portion (first partition part) of the partition 120 that surrounds the pixel region 140R was connected to the frame-like structure 110a, the portion (second partition part) of the partition 120 that surrounds the pixel region 140G was connected to the frame-like structure 110b, and the portion (third partition part) of the partition 120 that surrounds the pixel regions 140B was connected to the frame-like structure 110c. That is, band-like trenches in which the pixel region 140R was disposed in plurality in the vertical direction (region demarcated by the first partition part) were connected to the interior of the frame-like structure 110a; band-like trenches in which the pixel region 140G was disposed in plurality in the vertical direction (region demarcated by the second partition part) were connected to the interior of the frame-like structure 110b; and band-like trenches in which the pixel regions 140B were disposed in plurality in the vertical direction (region demarcated by the third partition part) were connected to the interior of the frame-like structure 110c. The taper angle of the partition 120 and the frame-like structures 110a, 110b, 110c was 85°. That is, the partition 120 and the frame-like structures 110a, 110b, 110c had a forward taper shape.

Next, the surface of the TFT substrate 200 was exposed to UV ozone for 2 minutes, to break down and remove unwanted impurities on the surface of the first electrode 250, and to impart lyophilicity to the first electrode 250, the edge cover 240 and the partition 120. Through the above treatment, the contact angle between water and the first electrode 250, the edge cover 240 and the partition 120 was brought to 30° or less. The contact angle between the frame-like structures 110a, 110b, 110c and water was likewise set to 30° or less.

The contact angle between water and the various members can be appropriately set taking into account the viscosity and surface tension of the coating liquid. Ordinarily, it is sufficient to set the contact angle to 60° or less (more preferably to 30° or less). If the contact angle exceeds 60°, the coating liquid may fail to thoroughly fill the pixel regions, giving rise to defective coating.

The pitch of each of the pixel regions 140R, 140G, 140B (i.e. size of the region that includes a non-emissive region such as partitions and so forth) was set to 240 μm (direction along the partition 120, i.e. vertical direction)×60 μm (direction orthogonal to the partition 120, i.e. left-right direction). The size of the exposed portion (i.e. emissive region) of the first electrode 250 was set to 190 μm (direction along the partition 120, i.e. vertical direction)×30 μm (direction orthogonal to the partition 120, i.e. left-right direction). The width of the partition 120 (length in the left-right direction) was set to 20 μm, and the width of the wall portions of the frame-like structures 110a, 110b, 110c was likewise set to 20 μm. The size of the region surrounded by the frame-like structures 110a, 110b was set to vertical direction 3 mm×left-right direction 38 mm. The size of the region surrounded by frame-like structure 110c was set to vertical direction 38 mm×left-right direction 3 mm. The length of the partition 120 in the vertical direction was set to 37.7 mm. The screen size of the organic EL display device 100 in the present example is vertical direction 36 mm×left-right direction 28.8 mm, and the resolution 106 ppi.

The width and height of the partition 120 can be appropriately set taking into account, among others, the size of the pixel regions 140R, 140G, 140B, the coating amount of the coating liquids and the aspect ratio (height to width ratio) of the partition 120. The width may be ordinarily set to range from about 5 to 100 μm (more preferably, from about 20 to 50 μm). The height may be ordinarily set to range from about 5 to 100 μm (more preferably, from about 20 to 50 μm). A width smaller than 5 μm not only makes the occurrence of patterning defects likely, but may also result in mixed colors as a result of coating liquid flowing over the partition 120 and intruding into another region. On the other hand, a width in excess of 100 μm may result in a smaller margin for forming the emissive regions of the pixel regions 140R, 140G, 140B. If the height is smaller than 5 μm, not only may the coating liquid flow over the partition 120 and intrude into other regions, but also a sufficient coating amount may fail to be held in the pixel regions 140R, 140G, 140B, and it may become impossible to obtain organic emissive layers 230R, 230G, 230B of a desired film thickness. By contrast, a height in excess of 100 μm may result in a larger functional material layer that adheres to the partition 120 after drying of the coating liquid, and it may become impossible to obtain organic emissive layers 230R, 230G, 230B of a desired film thickness.

The aspect ratio of the partition 120, as the proportion of the height to the width, may be set ordinarily to about 20 or less (more preferably to about 2 or less). Film delamination is likely, and patterning defects also likely, if the aspect ratio exceeds 20.

The width of the region surrounded by the partition 120 (length in the direction orthogonal to the partition 120, i.e. left-right direction) can be appropriately set with pixel size and so forth in mind, but is preferably set to be no greater than the width for which capillarity manifests itself. More specifically, the width of the region surrounded by the partition 120 may be set ordinarily to about 20 to 200 μm (more preferably, to about 40 to 100 μm). If the width is smaller than 20 μm, the film thickness of the functional material layer formed out of the coating liquid may become non-uniform in the pixels. On the other hand, a width in excess of 200 μm may result in weaker capillarity, and in a longer takt time required for filling the pixel region with the coating liquid.

The width and height of the frame-like structures 110a, 110b, 110c can be appropriately set taking into account, among others, the panel size, the coating amount of the coating liquids and the aspect ratio (height to width ratio) of the frame-like structures 110a, 110b, but may be ordinarily set to range from about 5 to 500 μm (more preferably, from about 20 to 50 μm). The height may be ordinarily set to about 5 to 100 μm. A width smaller than 5 μm makes the occurrence of patterning defects likely, and may result in flow of the coating liquid over the frame-like structures 110a, 110b, 110c, so that the coating liquid spills out of the frame-like structures 110a, 110b, 110c. A width in excess of 500 μm, on the other hand, results in a large frame region, which may hamper the design of the outer shape of the panel. A height smaller than 5 μm may result in flow of the coating liquid over the frame-like structures 110a, 110b, 110c, so that the coating liquid spills out of the frame-like structures 110a, 110b, 110c. On the other hand, a height in excess of 100 μm may result in a larger functional material layer that adheres to the frame-like structures 110a, 110b, 110c after drying of the coating liquid, so that a desired film thickness may fail to be achieved.

The aspect ratio (proportion of height to width) of the frame-like structures 110a, 110b, 110c is ordinarily set to about 20 or less (more preferably, about 2 or less). Film delamination is likely, and patterning defects also likely, if the aspect ratio exceeds 20.

The width of the region surrounded by the frame-like structures 110a, 110b, 110c (i.e. the length in the direction along the partition 120, i.e. length in the vertical direction: vertical width) can be appropriately set taking into account, among others, the panel size, the size of the display area 150, the coating amount of coating liquid and so forth, but is preferably set to be equal to or greater than a width that requires no high-precision positioning in a coater. From the viewpoint of bringing out capillarity effectively, the width of the region surrounded by the frame-like structures 110*a*, 110*b*, 110*c* is preferably greater than the width of the region surrounded by the partition 120. More specifically, the width of the region surrounded by the frame-like structures 110*a*, 110*b*, 110*c* may be ordinarily set to about 0.5 to 20 mm (more preferably, about 2 to 10 mm). If the width is smaller than 0.5 mm, the coating liquid may fail to be accurately coated onto the interior of the region surrounded by the frame-like structures 110*a*, 110*b*. A width in excess of 20 mm, on the other hand, results in a large frame region, which may hamper the design of the outer shape of the panel.

Next, the hole-injection layer-cum-hole-transport layer (hold-injection layer and hole-transport layer) 220 was overlaid, by vacuum evaporation, on the edge cover 240 and the first electrode 250 using N,N'-di(naphthalene-1-yl)-N,N'-diphenyl-benzidine (NPD) as the hole-transport material. The film thickness of the hole-injection layer-cum-hole-transport layer 220 was set to 50 nm.

Next, an R emissive layer solution (composition comprising the material of the organic emissive layer 230R; R coating liquid; first coating liquid) was produced using a polyfluorene-based red color luminescent material as the luminescent material of the organic emissive layer 230R(R organic emissive layer) and using an aromatic mixed solvent as the solvent. The viscosity of the R emissive layer solution was set to about 20 mPa·s, and the surface tension was adjusted to about 40 mN/m. The R emissive layer solution was applied into the frame-like structure 110*a* by an ink-jet method. The R emissive layer solution (filling liquid 130*a*) that was pooled within the frame-like structure 110*a* filled (coated) the pixel region 140R easily by capillarity, by virtue of the lyophilicity of the partition 120. At this time, the pixel regions 140G, 140B were isolated from the pixel region 140R by the partition 120, and hence there was no intrusion of the filling liquid 130*a*. Some filling liquid 130*a* remains within the region surrounded by the frame-like structure 110*a*, so that the same material as that of the organic emissive layer 230R remains after a below-described drying step.

Next, a G emissive layer solution (composition comprising the material of the organic emissive layer 230G; G coating liquid; second coating liquid) was produced using a polyfluorene-based green color luminescent material as the luminescent material of the organic emissive layer 230G (G organic emissive layer) and using an aromatic mixed solvent as the solvent. As in the R emissive layer solution, the viscosity of the G emissive layer solution was set to about 20 mPa·s, and the surface tension was adjusted to about 40 mN/m. The G emissive layer solution was applied into the frame-like structure 110*b* by an ink-jet method. As in the case of the R emissive layer solution, the G emissive layer solution (filling liquid 130*b*) that was pooled within the frame-like structure 110*b* filled (coated) the pixel region 140G by capillarity. At this time, the pixel regions 140R, 140B were isolated from the pixel region 140G by the partition 120, and hence there was no intrusion of the filling liquid 130*b*. Some filling liquid 130*b* remains within the region surrounded by the frame-like structure 110*b*, so that the same material as that of the organic emissive layer 230G remains after a below-described drying step.

Next, a B emissive layer solution (composition comprising the material of the organic emissive layer 230B; B coating liquid; third coating liquid) was produced using a polyfluorene-based blue luminescent material as the luminescent material of the organic emissive layer 230B (B organic emissive layer) and using an aromatic mixed solvent as the solvent. The viscosity of the B emissive layer solution was set to about 10 mPa·s, and the surface tension was adjusted to about 40 mN/m. The B emissive layer solution was applied into the frame-like structure 110*c* by an ink-jet method. As in the cases of the R and G emissive layer solutions, the B emissive layer solution (filling liquid 130*c*) that was pooled within the frame-like structure 110*c* filled (coated) the pixel regions 140B by capillarity. The interior of the frame-like structure 110*c* and the region demarcated by the third partition part are connected by one opening. Therefore, the filling liquid 130*c* was sequentially filled (coated) from the side closer to the frame-like structure 110*c*. At this time, the pixel regions 140R, 140G were isolated from the pixel region 140B by the partition 120, and hence there was no intrusion of the filling liquid 130*c*. Some filling liquid 130*c* remains within the region surrounded by the frame-like structure 110*c*, so that the same material as that of the organic emissive layer 230B remains after a below-described drying step.

Thus, the frame-like structures 110*a*, 110*b*, 110*c* and the partition 120 function as damming members (partitioning members) that prevent the coating liquid from spreading beyond a predetermined position. The frame-like structures 110*a*, 110*b*, 110*c* function as fences in that a coating liquid comprising a functional material pools within the region surrounded by the frame-like structures 110*a*, 110*b*, 110*c*, and the coating liquid fills (flows out into) the region demarcated by the partition 120, through openings, by exploiting the flow of coating liquid that occurs due to capillarity and the like.

Thereafter, the TFT substrate 200 in which the emissive layer solution had been coated onto the pixel regions 140R, 140G, 140B, was dried for 30 minutes under vacuum at 1 Pa or less. The solvent component in the emissive layer solution was then dried off through baking in a normal-pressure nitrogen atmosphere at 200° C. for 60 minutes, to form as a result the organic emissive layers 230R, 230G, 230B. The film thickness of all the organic emissive layers 230R, 230G, 230B was set to 50 nm.

Next, Ba and Al were overlaid, in this order, in accordance with known techniques, in this order, onto the TFT substrate 200 in which the hole-injection layer and the hole-transport layer 220 plus the organic emissive layers 230R, 230G, 230B had been formed, to form thereby the second electrode 260.

In the organic EL display device 100 produced according to the above-described procedure, the coating liquids are discharged (injected) into the frame-like structures 110*a*, 110*b*, 110*c*; thereby, each coating liquid fills (coats) the pixel regions 140R, 140G, 140B, by capillarity, and the organic emissive layers 230R, 230G, 230B are formed. Thus, an organic EL display device free of mixed colors could be produced in a simple manner. By contrast, forming the pixel regions 140R, 140G, 140B of each color by vacuum evaporation using a evaporation mask, as in conventional organic EL display devices, involved several problems in terms of suitability for production. For instance, the evaporation mask and the substrate must be aligned with high precision, and the weight of evaporation masks used for large substrates becomes very substantial. As a result, not only was alignment difficult, but also the device exhibited problems associated with weight endurance. Among further problems, evaporation mask changeover required greater effort, while safety was harder to ensure. Also, producing a high-definition organic EL display device using an evaporation mask was difficult in that high-precision aligning between the evaporation mask and the substrate is required, and in that technologies for minimizing evaporation blur (technologies for clearly defining the boundaries between pixels of dissimilar colors)

are required. However, the pixel regions of the respective colors can be coated separately in an easy manner on account of capillarity by following the procedure of the present example, and hence none of the above-described problems occurs at all. Therefore, large-substrate high-definition organic EL display devices can be manufactured without resorting to any advanced technique.

Methods in which the organic emissive layers 230R, 230G, 230B are formed through filling of emissive layer solutions of each color, by an ink-jet method, into the respective pixel regions 140R, 140G, 140B, may suffer from variability in the film thickness of the organic emissive layers 230R, 230G, 230B for each pixel region on account of variability in the amount of coating liquid. In high-definition organic EL display devices it was also necessary to perform high-precision control of the discharge position. As a result, solution leaked into adjacent pixel regions and/or mixed colors occurred between adjacent pixel regions. When the procedure of the present example is followed, however, the emissive layer solution fills (coats) the pixel regions (pixel regions 140R, 140G, 140B) of three colors on account of capillarity, and the amount of coating liquid that fills the first to third demarcation regions is averaged through capillarity. Therefore, the film thickness of the organic emissive layers 230R, 230G, 230B exhibits no variability between pixel regions of the same color. Also, coating liquid is discharged, by a ink-jet method, only at the frame-like structures 110a, 110b, 110c that are formed sufficiently widely outside the display area 150. Therefore, the discharge position requires no high-precision control, and the concern of occurrence of mixed colors is allayed.

In the present example, the pixel regions 140B formed using the frame-like structure 110c (third frame-like structure) are disposed in the form of two regions (two pixels) for one picture element. Herein, B has ordinarily lower characteristics in terms of brightness efficiency and life as compared with other colors. As a result, life can be prolonged effectively by reducing the brightness per one pixel. Thus, the color of the pixel region formed using the third frame-like structure is preferably B in a case where one picture element is made up of RGB.

In the present example, the viscosity of the solution (filling liquid 130c) that comprises the material of the organic emissive layer 230B was set lower than the viscosity of the solution (filling liquid 130a) comprising the material of the organic emissive layer 230R and than the viscosity of the solution (filling liquid 130b) comprising the material of the organic emissive layer 230G. The reasons for this are explained below.

The frame-like structure 110a has respective openings for each of the plurality of columns that comprise the pixel region 140R. The frame-like structure 110b has respective openings for each of the plurality of columns that comprise the pixel region 140G. Therefore, the distance traveled by the coating liquid in the process of filling the coating liquid into the pixel regions 140R, 140G is short. By contrast, the frame-like structure 110c has only one opening for the plurality of columns that comprise the pixel regions 140B. Therefore, the distance traveled by the coating liquid in the process of filling the coating liquid into the pixel regions 140B is long, and hence the takt time (filling time) is longer than in the process of filling the coating liquids into the pixel regions 140R, 140G. In the present example, however, the viscosity of the filling liquid 130c is low, and hence it was possible to limit the length of the takt time. Preferably, thus, the viscosity of a coating liquid that fills a region having a meandering shape is lower than the viscosity of a coating liquid that fills a straight-line region. The viscosity of the filling liquid 130c is not limited thereto, if the takt time allows, and for instance the viscosity of all the coating liquids may be identical. Alternatively, the viscosity of the coating liquid that fills a straight line region (for instance, the solution comprising the material of the organic emissive layer 230R) may be set to be lowest.

In the present example there is used an ink-jet method as the method for pooling a coating liquid inside the frame-like structures 110a, 110b, 110c, but the method for pooling the coating liquid is not particularly limited. The method used may involve, for instance, nozzle coating, or using a dispenser, or spray-coating of a localized region.

In the present example, the organic emissive layers 230R, 230G, 230B alone are formed by capillarity, but the embodiment is not particularly limited thereto, and capillarity may also be used in other functional material layers. For instance, a hole-transport layer may be formed by filling (coating) the hole-transport layer solution into all the pixel regions 140R, 140G, 140B by following a procedure identical to that of the organic emissive layers 230R, 230G, 230B, after which the organic emissive layers 230R, 230G, 230B can be stacked on the hole-transport layer according to the above-described method. Thus, other different coating liquids can be further injected into frame-like structures 110a, 110b, 110c by removing, through baking or the like, the solvent component of coating liquids that have been injected into the frame-like structures 110a, 110b, 110c. In this case, however the solvent used in the solution that is filled later is selected preferably in such a manner that the film formed previously (for instance, a hole-transport layer) does not re-dissolve in the solution that is filled thereafter (for instance, solution comprising a luminescent material). Alternatively, there is performed an insolubilization treatment of the film that is formed previously, for instance by cross-linking reactions or the like.

In order to achieve a microcavity (microresonator) effect in a top-emission structure, it may be necessary in some cases to set a dissimilar total film thickness, for each color, of the functional material layer that is disposed on the pixel regions 140R, 140G, 140B. Herein, the microcavity effect is an effect whereby purity of color and front brightness efficiency are enhanced through formation of a microresonator structure between the anode and the cathode of the organic EL element. The total film thickness that allows obtaining an optimal microcavity effect is different for each color. In order to realize the above thickness differences, conventional technologies required forming individual functional material layers, for instance hole-transport layers, of dissimilar film thickness for each color of the pixel regions. Therefore, not only was formation of the hole-transport layer and so forth bedeviled by the same problem as upon formation of the organic emissive layers 230R, 230G, 230B through separate coating for each color, but also masks had to be changed, or mask position shifted, to form each color, in cases where the layers were formed by vacuum evaporation. The number of film formation operations increased therefore from once to twice or three times, which was problematic. In the method of the present example, however, pixel regions of dissimilar colors are demarcated by the partition 120, and hence the film thickness of the functional material layer disposed on the pixel regions 140R, 140G, 140B can be easily made dissimilar for each color by adjusting the concentration or amount of the solution that is discharged onto the frame-like structures 110a, 110b, 110c. Also, the discharge process does not vary among the frame-like structures 110a, 110b, 110c, and hence the number of film formations does not increase.

In the present example, the hole-injection layer and hole-transport layer (hole-injection layer-cum-hole-transport layer) 220 and the organic emissive layers 230R, 230G, 230B are used as functional material layers, but other layers, for instance electron-transport layers, carrier blocking layers or the like may be additionally stacked. As the functional material layer there may be formed the organic emissive layers 230R, 230G, 230B alone. In this case, all the functional material layers may be overlaid by capillarity by filling (coating) all the functional material layer by capillarity.

In the present example the partition 120 has a forward taper shape. This allows preventing disconnects of the second electrode 260 and wiring on account of the partition 120. However, the partition 120 may have a reverse taper shape. In a case where the partition 120 has a reverse taper shape, not only is there arguably a reduced risk that the filling liquid should flow over the partition 120, but also a stronger manifestation of capillarity can be expected. However, the second electrode 260 may be disconnected from wiring by the partition 120 having a reverse taper shape, and hence it becomes necessary to separately provide a method for electrically connecting wiring to the second electrode 260 disposed on the pixel regions 140R, 140G, 140B (i.e. to the portion of the second electrode 260 within the partition 120).

In the present example, the contact angle between water and the first electrode 250, the edge cover 240 and the partition 120 was set to 30° or less, but the contact angle is not limited thereto. The contact angle may be any contact angle that enables filling (coating) of the coating liquid by capillarity.

In the present example, a polyfluorene-based luminescent material is used as the luminescent material of the organic emissive layers 230R, 230G, 230B, but the luminescent material is not limited thereto, and other functional materials (luminescent materials) may also be used.

In the present example, the partition 120 is formed using a dry film of a photosensitive resin, but the partition is not limited thereto. For instance, an inorganic film such as silicon nitride or the like may be formed by CVD or the like, and the film may be patterned, to form the partition 120. A conductive material may also be used as the partition material.

The present example illustrates an active matrix-type organic EL display device 100, but the embodiment can be likewise realized in the form of a passive matrix-type organic EL display device 100 in which no TFTs are formed.

As illustrated in FIG. 3, a space is provided in the present example between the frame-like structure 110c and the first partition part, but this space need not to be provided. Specifically, part of the frame-like structure 110c may function as the first partition part. If a space exists, however, intrusion of the filling liquid 130c into the pixel region 140R demarcated by the first partition part can be prevented just by simply causing the coating liquid to be held within that space, even if the position at which the coating liquid is discharged deviates from the frame-like structure 110c towards the first partition part upon discharge of the coating liquid onto the frame-like structure 110c. That is, the space allows preventing the occurrence of mixed colors due to a wrong discharge position. Such a preferred effect can be similarly achieved by providing a space between the frame-like structure 110c and the frame-like structures 110a, 110b.

Example 2

Figure 5:
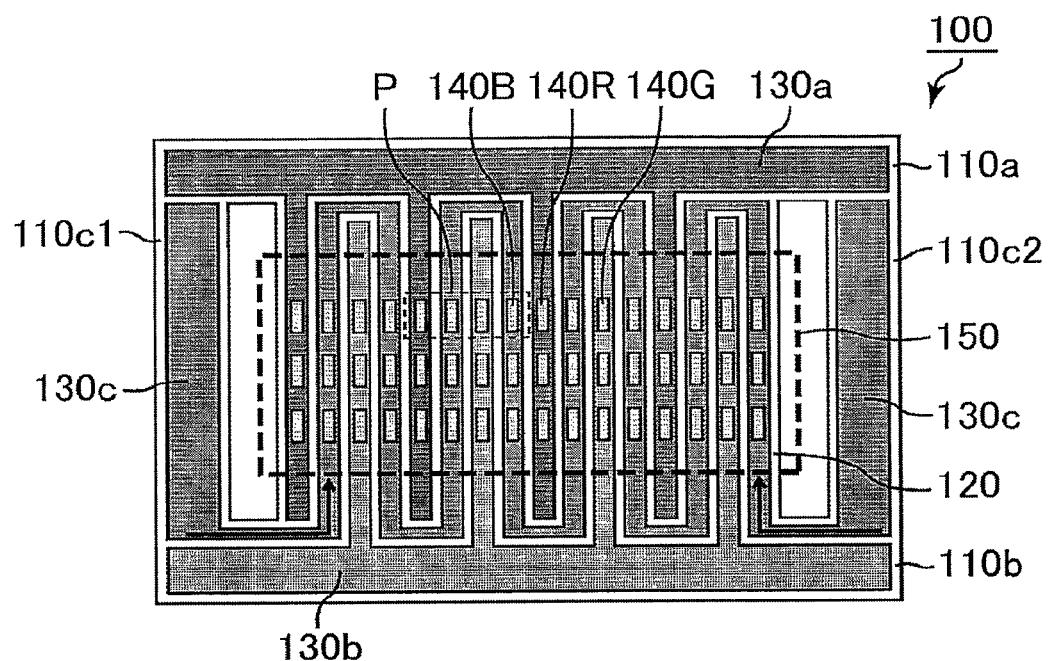
FIG. 5 is a plan-view schematic diagram illustrating the periphery of a display area of an organic EL display device of Example 2.

Next, an organic EL display device of Example 2 will be explained in detail with reference to FIG. 5. FIG. 5 is a plan-view schematic diagram illustrating the periphery of a display area of the organic EL display device of Example 2.

In the organic EL display device 100 of the present example, as illustrated in FIG. 5, a frame-like structure 110c1 is disposed on the left side of the display area 150, and a frame-like structure 110c2 is disposed on the right side of the display area 150. Both frame-like structures 110c1, 110c2 correspond to the third frame-like structure. In the present example, thus, there are disposed two third frame-like structures, whereas in Example 1 only one such structure is disposed. Other features are identical to those of Example 1.

As in Example 1, the third demarcation region has a meandering shape along the contours of the first demarcation region and the second demarcation region. The frame-like structures 110c1, 110c2 have each one opening on the side of the display area 150. The third demarcation region is connected thereby to the interior of the frame-like structures 110c1, 110c2. The width and length of the frame-like structures 110c1, 110c2 are the same as those of the frame-like structure 110c of Example 1.

As in Example 1, the R and G emissive layer materials were filled (coated) into the pixel regions 140R, 140G. Next, as in Example 1, a coating liquid (filling liquid 130c) comprising a B emissive layer material was prepared, and the coating liquid was coated, in accordance with an ink-jet method, onto the interior of the frame-like structures 110c1, 110c2. Herein, the coating amount onto the frame-like structures 110c1, 110c2 was set to half that in Example 1. The filling liquid 130c that was pooled in the frame-like structures 110c1, 110c2 filled (coated), by capillarity, the pixel regions 140B. The coating liquid flows from inside the frame-like structures 110c1, 110c2 into the region demarcated by the third partition part. Therefore, the coating liquid was filled (coated) into the region demarcated by the third partition part sequentially from both of the left side and the right side of the display area 150. Herein, the pixel regions 140R, 140G were isolated from the pixel region 140B by the partition 120, and hence there was no intrusion of the filling liquid 130c.

In an organic EL display device manufactured according to the above procedure, coating liquid can be injected into the third demarcation region (region at which the pixel regions 140B are formed) from the third frame-like structures 110c1, 110c2. Therefore, the time required for filling (coating) the coating liquid into the pixel regions 140B was halved with respect to that in Example 1. As a result, the takt time was further shortened and there could be further suppressed variability in the film thickness of the organic emissive layers 230R, 230G, 230B caused by solvent drying in the step of filling (coating) the emissive layer solution. The overall manufacturing time as well could be shortened.

In the present example, the third frame-like structures 110c1, 110c2 are formed to a same size, but sizes are not limited thereto. The size of the third frame-like structures 110c1, 110c2 may vary as allowed by the design of the organic EL display device.

Example 3

An organic EL display device of Example 3 will be explained next in detail with reference to FIGS. 6 and 7.

Figure 6:
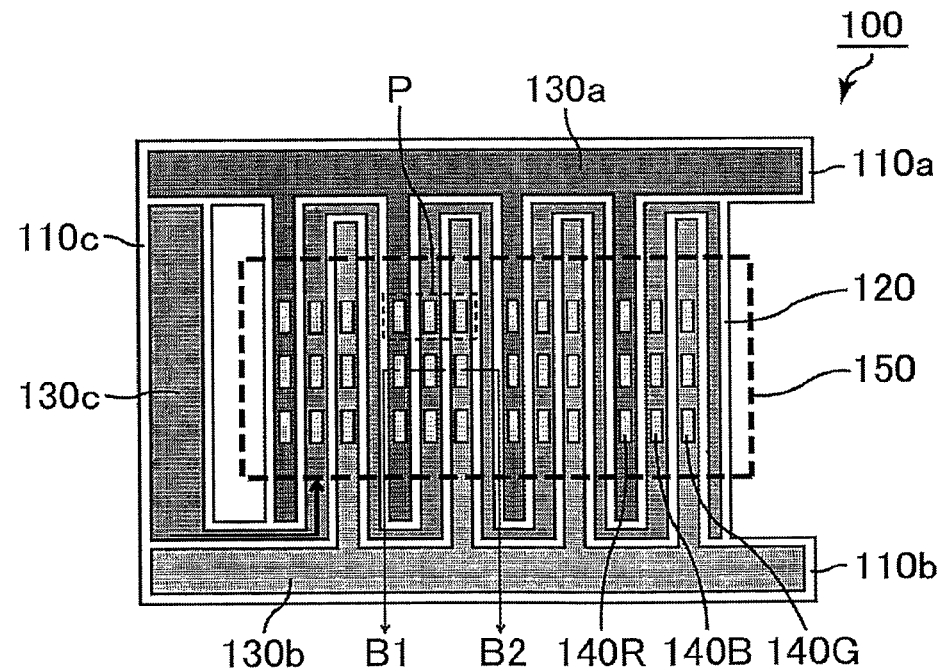
FIG. 6 is a plan-view schematic diagram illustrating the periphery of a display area of an organic EL display device of Example 3.
Figure 7:
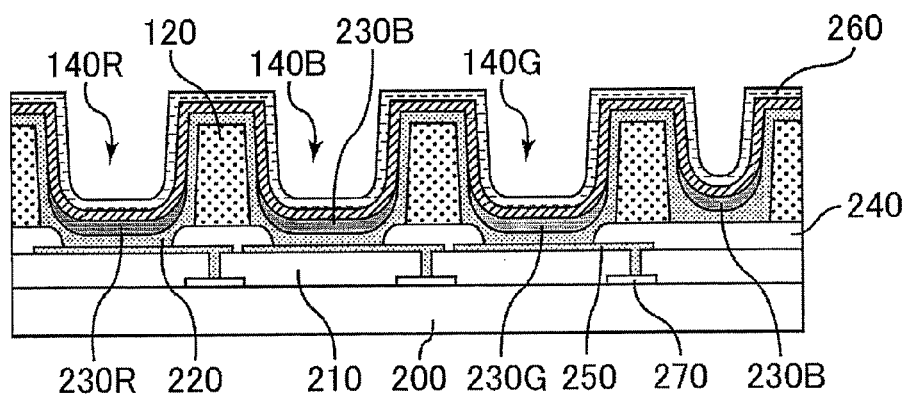
FIG. 7 is a cross-sectional schematic diagram of FIG. 6 along line B1-B2.

FIG. 6 is a plan-view schematic diagram illustrating the periphery of a display area of the organic EL display device of Example 3. FIG. 7 is a cross-sectional schematic diagram of FIG. 6 along line B1-B2.

As illustrated in FIG. 6, one picture element (region denoted by P in FIG. 6) has an R/G/B configuration. A portion (connection line) of the third demarcation region in which the pixel regions 140B are not disposed is formed between adjacent picture elements in the row direction. Other features are identical to those of Example 1.

As in Example 1, the first electrode 250 was formed using ITO, in accordance with the same method as in Example 1, on the substrate 200 that is formed up to the interlayer dielectric 210. Herein, however, no first electrode 250 was formed at a region where the connection line is disposed. The edge cover 240 was formed next, in accordance with the same method as in Example 1, but herein the edge cover 240 was formed so as to cover the region at which the connection line was disposed.

The partition 120 was formed next in accordance with the same method as in Example 1. A partition that demarcated the connection line was formed at the same time. The columns made up of pixel regions 140B that are adjacent in the vertical direction are disposed side by side, such that the connection lines are disposed between the columns. That is, the regions at which there are disposed the columns made up of the pixel regions 140B are connected to each other by way of the connection lines. The length of the connection lines (direction along the partition 120, i.e. vertical direction) was set to be identical to that of the partition (third partition part) that demarcates the plurality of pixel regions 140B, the width (distance between partitions that demarcate the connection lines) was set to 10 μm, and the width of the partition that demarcates the connection lines was set to 20 μm. The pitch (size of the region that includes a non-emissive region such as partitions and so forth) of each of the pixel regions 140R, 140G, 140B was set to 240 μm (direction along the partition 120, i.e. vertical direction)×70 μm (direction orthogonal to the partition 120, i.e. left-right direction). The size of the exposed portion (i.e. emissive region) of the first electrode 250 was set to 190 μm (direction along the partition 120, i.e. vertical direction)×40 μm (direction orthogonal to the partition 120, i.e. left-right direction). The width and length of other constituent elements are the same as those in Example 1, and the resolution is likewise 106 ppi.

An organic EL display device was manufactured, in accordance with the same method as in Example 1, out of the substrate 200 having the partition 120 formed thereon. The same emissive layer solution as in Example 1 was prepared as the B emissive layer material. Upon application of the emissive layer solution on the frame-like structure 110c, the filling liquid 130c filled (coated) all the pixel regions 140B via the connection lines.

In the organic EL display device manufactured in accordance with a procedure such as the above-described one, the emissive layers are formed individually, by capillarity, at each pixel region. This affords the same advantages as in Example 1. At the same time, the pixel regions 140R, 140G, 140B are disposed one region each per one picture element. This configuration is identical to that of picture elements in conventional organic EL display devices, and hence the same conventional driving methods and control methods can be used.

Further, the width of the connection line is made narrower, and hence the emissive region of each pixel can be widened. Capillarity is stronger for narrower widths, and hence providing the connection lines allows shortening the takt time of the process of filling (coating) the coating liquid onto the pixel regions 140B.

In the present example, the third frame-like structure 110c is formed on one side of the display area 150, but can obviously be formed on both sides, as in Example 2.

In the present example, the edge cover 240 is formed at regions at which the connection lines are disposed, but the edge cover 240 need not be formed at regions at which the connection lines are disposed.

Example 4

Next, an organic EL display device of Example 4 will be explained in detail with reference to FIG. 8.

Figure 8:
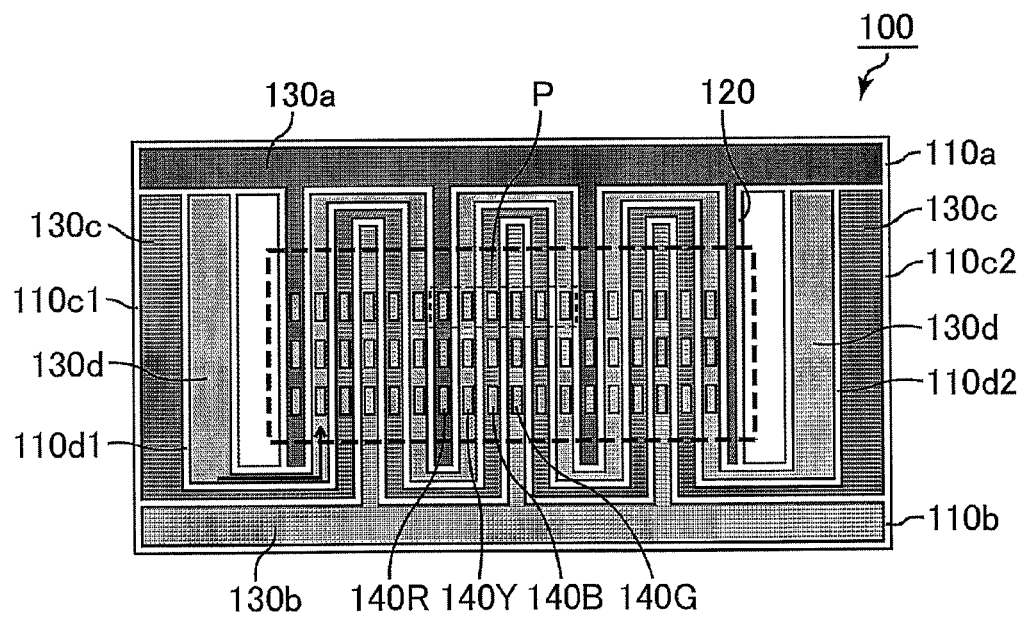
FIG. 8 is a plan-view schematic diagram illustrating the periphery of a display area of an organic EL display device of Example 4.

FIG. 8 is a plan-view schematic diagram illustrating the periphery of a display area of the organic EL display device of Example 4. The region denoted by P in FIG. 8 represents one picture element.

As illustrated in FIG. 8, in the organic EL display device 100 of the present example, a frame-like structure 110d1 is disposed between the display area 150 and the frame-like structure 110c1, and a frame-like structure 110d2 is disposed between the display area 150 and the frame-like structure 110c2. Pixel regions 140R, 140G, 140B, 140Y are disposed in the form of a matrix within the display area 150. The pixel regions 140Y are yellow (Y) pixel regions. Thus, one picture element in the present example comprises pixels of four colors, such that each pixel is disposed in the sequence R/Y/B/G/B/Y. Other features are identical to those of Example 2.

The region (fourth demarcation region) demarcated by a fourth partition part (portion of the partition 120 that demarcates the pixel regions 140Y) has a meandering shape along the contour line of the region (third demarcation region) demarcated by the third partition part. The frame-like structures 110d1, 110d2 have each one opening on the side of the display area 150. Thereby, the fourth demarcation region is connected to the interior of the frame-like structures 110d1, 110d2.

The partition 120 and the frame-like structures 110a, 110b, 110c1, 110c2 can be formed in accordance with the same method as in Example 2. The width and the length of the frame-like structures 110d1, 110d2 were set to be identical to those of the frame-like structures 110c1, 110c2, respectively. The length of the frame-like structures 110a, 110b may be identical to those of Examples 1 and 2. In the present example, however, the device was manufactured by lengthening the frame-like structures 110a, 110b proportionally to the area over which the frame-like structures 110d1, 110d2 were formed on both sides of the display area 150 (i.e. twice the sum of the width of 3 mm of the region surrounded by the frame-like structure of the frame-like structures 110a, 110b and the width of 20 μm of the wall portion of the frame-like structures 110a, 110b).

The pitch (size of the region that includes a non-emissive region such as the partition 120 and so forth) of each of the pixel regions 140R, 140G, 140B, 140Y was set to 360 μm (direction along the partition 120, i.e. vertical direction)×60 μm (direction orthogonal to the partition 120, i.e. left-right direction). The size of the exposed portion (i.e. emissive region) of the first electrode 250 was set to 310 μm (direction along the partition 120, i.e. vertical direction)×30 μm (direction orthogonal to the partition 120, i.e. left-right direction). The width of the partition 120 (length in the left-right direction) was set to 20 μm, and the width of the wall portions of the frame-like structures 110a, 110b, 110c, 110d was likewise set to 20 μm. The size of the region surrounded by the frame-like structures 110a, 110b was set to vertical direction 3 mm×left-right direction 44 mm. The size of the region surrounded by the frame-like structures 110c, 110d was set to vertical direction 38 mm×left-right direction 3 mm. The length of the partition 120 in the vertical direction was set to 37.7 mm. The screen size of the organic EL display device 100 in the present example is vertical direction 36 mm×left-right direction 28.8 mm, and the resolution is 70 ppi.

Herein, R, G and B emissive layer materials were filled (coated) in the same way as in Example 2, and thereafter an emissive layer solution was prepared using a polyfluorene-based yellow luminescent material as the Y emissive layer material and employing an aromatic mixed solvent as a solvent. The viscosity of the Y emissive layer solution was set to about 10 mPa·s, and the surface tension was adjusted to about 40 mN/m. The emissive layer solution was applied into the frame-like structures 110*d*1, 110*d*2 by an ink-jet method. The coating amount at this time was set identical to that of the B emissive layer solution of Example 2. The emissive layer solution (filling liquid 130*d*) that was pooled within the frame-like structures 110*d*1, 110*d*2 filled (coated) the pixel regions 140Y by capillarity. The coating liquid flows from inside the frame-like structures 110*d*1, 110*d*2 into the fourth demarcation region. Therefore, the coating liquid was filled (coated) into the fourth demarcation region sequentially from both of the left side and the right side of the display area 150. Herein, the pixel regions 140R, 140G, 140B were isolated from the pixel regions 140Y by the partition 120, and hence there was no intrusion of the filling liquid 130*d*.

In an organic EL display device manufactured according to a procedure such as the above-described one, one picture element can have an R/Y/B/G/B/Y configuration. Thus, the color gamut that can be represented was expanded through formation of a Y pixel region of yellow emission, in addition to R, G and B. This afforded an organic EL display device of yet higher quality.

All the emissive layer solutions were filled (coated) by capillarity, and hence, the organic EL display device having an additional Y pixel region involved addition of only the process of coating the frame-like structures 110*d*1, 110*d*2 with the Y emissive layer solution, and thus no complex supplementary processes were required. Therefore, emission colors can be added in a simple manner and at a low cost by using the method according to the present example.

In the present example there are formed two fourth frame-like structures (frame-like structures 110*d*1, 110*d*2) for forming pixel regions of a fourth color. Needless to say, however, the fourth frame-like structure may be formed on a single side, either left or right, of the display area 150, as in the case of the third frame-like structure 110*c* of Example 1. The fourth frame-like structure need not necessarily be formed on the left or right side of the display area 150. The fourth frame-like structure can be formed at an arbitrary position, for instance in the vertical direction of the display area 150, so long as the emissive layer solution can fill (coat) the pixel regions 140Y through connection of the fourth frame-like structure and the partition (fourth partition part) that demarcates the pixel regions 140Y and through coating of the fourth frame-like structure with the emissive layer solution. Conceivably, for instance, the frame-like structure 110*d*1 may be formed outward of the frame-like structure 110*a* (i.e. on the side spaced apart from the display area 150), and there may be formed a region newly demarcated between the frame-like structure 110*c*1 and the frame-like structure 110*a*, such that the interior of the frame-like structure 110*d* and the region demarcated by the fourth partition part (i.e. region at which the pixel regions 140Y are disposed) are connected by way of the abovementioned newly demarcated region.

In the present example, a configuration has been explained wherein pixel regions 140Y are added, and one picture element comprises thus pixels of four, colors. Needless to say, however, the embodiment is not limited thereto, and pixels of any other number of colors can also be added. In such a case, there are used the same procedures as employed for forming the pixel regions 140Y and the frame-like structures 110*d*, 110*d*2. Conceivably, for instance, a region (region demarcated by a fifth partition part) having a meandering shape in a plan view may be formed along the contour line of the fourth demarcation region, a pixel region of a color other than R, G, B and Y may be formed at that region, and a fifth frame-like structure for coating the pixel region may be formed further inward of the frame-like structure 110 frame-like structure d1 (i.e. further on the side of the display area 150), such that the interior of the fifth frame-like structure is connected to the region demarcated by the fifth partition part. The method of the present example allows expanding the number of emission colors in the pixels comprised in one picture element, within ranges as allowed by design in terms of, for instance, picture element size.

The pixel regions 140Y disposed in one picture element can be made into one pixel region through the use of the connection line explained in Example 2.

Example 5

Example 5 of the present invention will be explained next in detail with reference to FIG. 9.

Figure 9:
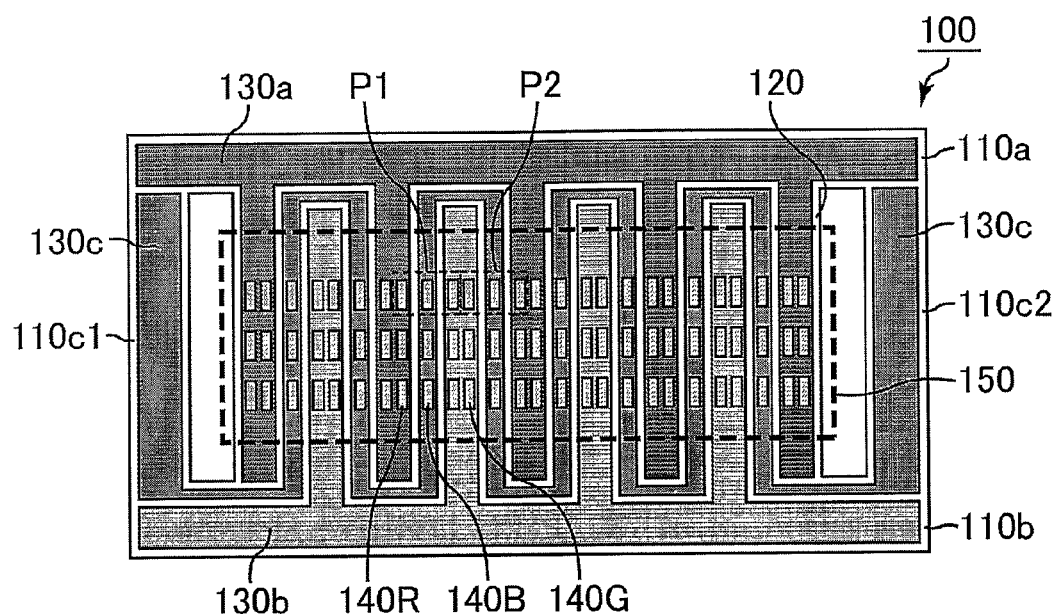
FIG. 9 is a plan-view schematic diagram illustrating the periphery of a display area of an organic EL display device of Example 5.

FIG. 9 is a plan-view schematic diagram illustrating the periphery of a display area of an organic EL display device of Example 5. The regions denoted by P1 and P2 in FIG. 9 represent each one picture element. In the picture element denoted by P1, pixels are disposed in the order R/B/G from the left, while in the picture element denoted by P2, conversely, pixels are disposed in the order G/B/R. In the present example, pixels are disposed point-symmetrically in picture elements that are adjacent in the row direction.

In Examples 1 to 4, the pixel regions 140R, 140G are demarcated for every column. In the present example, by contrast, the pixel regions 140R, 140G are demarcated for every two columns. The pixel regions 140B are demarcated in the same way as in Examples 1, 2 and 4. Other features are identical to those of Example 2.

The pitch (size of the region that includes a non-emissive region such as partitions and so forth) of each of the pixel regions 140R, 140G, 140B was set to 240 (direction along the partition 120, i.e. vertical direction)×80 μm (direction orthogonal to the partition 120, i.e. left-right direction). The size of the exposed portion (i.e. emissive region) of the first electrode 250 was set to 190 μm (direction along the partition 120, i.e. vertical direction)×60 μm (direction orthogonal to the partition 120, i.e. left-right direction), for the pixel regions 140R, 140G, and to 190 μm×50 μm, for the pixel regions 140B. The width of the partition 120 (length in the left-right direction) was set to 20 μm. Other dimensions are identical to those of Example 1. The resolution is 106 ppi, as in Example 1.

The same method of Example 2 can be used as the manufacturing method herein.

In an organic EL display device manufactured in accordance with a procedure such as the above-described one, although pixels are arranged point-symmetrically between adjacent picture elements in the row direction as illustrated in FIG. 9, one of each pixel region 140R, 140G, 140B is disposed in one picture element. This configuration is identical to that of conventional organic EL display devices, and hence the same conventional driving methods and control methods can be used. As a result, this allows curbing increases in manufacturing costs as well as loss of display quality that arise from complex driving methods and control methods.

Also, one of each pixel region 140R, 140G, 140B can be disposed in one picture element without using the connection line explained in Example 3. This allows reducing the size of the region that does not contribute to display within the display area 150, as compared with Example 3.

Embodiment 2

Figure 10:
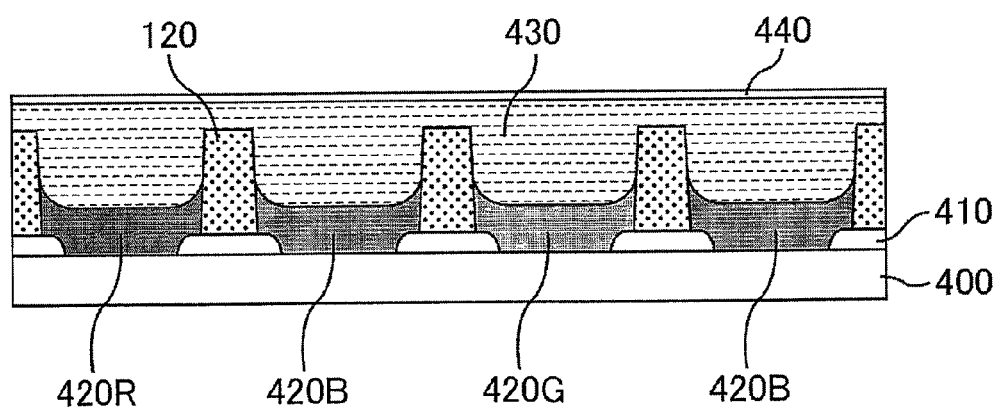
FIG. 10 is a cross-sectional schematic diagram illustrating a color filter substrate of Example 6, and is a cross-sectional schematic diagram illustrating a color filter substrate of Embodiment 2.

FIG. 10 is a cross-sectional schematic diagram illustrating a color filter substrate of Embodiment 2. As illustrated in FIG. 10, the color filter substrate of the present embodiment has a structure wherein a substrate 400 has sequentially stacked thereon, from the side of the substrate 400, a light-shielding layer (BM layer) 410, a partition 120, colored layers 420R, 420G, 420B, a planarizing layer 430 and an electrode 440. The light-shielding layer 410 has an opening at each pixel region at which the colored layers 420R, 420G, 420B are formed. The partition 120 is a member for separating the colored layers 420R, 420G, 420B and for holding a coating liquid (solution). The partition 120 is insulating. The planarizing layer 430 is a member for planarizing the surface of the color filter substrate. The colored layers 420R, 420G, 420B function as color filters, such that light passing through the colored layers 420R, 420G, 420B is absorbed by the colored layers 420R, 420G, 420B and is converted into light having an arbitrarily desired spectrum. The electrode 440 is a transparent electrode that lets light through.

A resin comprising a pigment or a dye can be used as the material of the colored layers 420R, 420G, 420B.

The substrate used as the substrate 400 is not particularly limited, so long as the substrate is transparent. Herein there can be used, for instance, a glass substrate or a plastic substrate.

The same materials as in Examples 1 to 5 may be used as the partition 120.

Ordinary materials may be used as the materials of the light-shielding layer 410 and of the planarizing layer 430.

The electrode 440 is not particularly limited, so long as the electrode is transparent. A conductive metal oxide (ITO, IZO, ZnO, $SnO_2$ or the like) may be used herein.

Example 6

A color filter substrate of Example 6 of the present invention will be explained next in detail with reference to FIG. 10.

FIG. 10 is a cross-sectional schematic diagram illustrating a color filter substrate of Example 6. A plan-view schematic diagram of the color filter substrate of the present example is identical to that of FIG. 3.

In the color filter substrate 100 of the present example, as illustrated in FIG. 3, pixel regions 140R, 140G, 140B are arrayed in the order R/B/G/B from the left, in the same way as in Example 1, such that pixel regions of a same color are arranged in the orthogonal (vertical) direction. The color filter substrate 100 of the present example is thus a stripe-array color filter substrate.

As illustrated in FIG. 10, a light-shielding layer 410 is formed on the substrate 400 so as to surround each of the pixel regions 140R, 140G, 140B that are provided in the form of a matrix.

As in Example 1, an insulating partition 120 that separates, for each color, the pixel regions 140R, 140G, 140B of various colors, is formed on the light-shielding layer 410. A frame-like structure 110a is connected to the portion of the partition 120 that surrounds the pixel region 140R (first partition part), a frame-like structure 110b is connected to the portion (second partition part) of the partition 120 that surrounds the pixel region 140G, and a frame-like structure 110b is connected to the portion (third partition part) of the partition 120 that surrounds the pixel regions 140B. The structure of the partition 120 and the frame-like structures 110a, 110b, 110c are identical to those of Example 1.

The colored layer 420R(R colored layer 420) is formed in the frame-like structure 110a and the region (first demarcation region) demarcated by the first partition part; the colored layer 420G (G colored layer) is formed in the frame-like structure 110b and the region (second demarcation region) demarcated by the second partition part; and the colored layer 420B (B colored layer) is formed in the frame-like structure 110c and the region (third demarcation region) demarcated by the third partition part.

The planarizing layer 430 is formed so as to cover the colored layers 420R, 420G, 420B and the partition 120, and the electrode 440 is formed so as to cover the planarizing layer 430.

In the present example, thus, stripe-like trenches are formed for each color, such that the pixel regions 140R, 140G, 140B of respective colors are separated by the trenches. The first demarcation region at which the pixel region 140R is disposed is connected to the interior of the frame-like structure 110a, the second demarcation region at which the pixel region 140G is disposed is connected to the interior of the frame-like structure 110b, and the third demarcation region at which the pixel regions 140B are disposed is connected to the interior of the frame-like structure 110c. Coating liquids can be filled (coated) onto the display area 150, thanks to capillarity, by injecting the coating liquid onto the frame-like structures 110a, 110b, 110c.

A method for manufacturing the color filter substrate of the present example will be explained next.

Firstly, a photosensitive resin was coated to a thickness of 2 μm, onto the glass substrate 400, and the light-shielding layer 410 was formed by photolithography. As the photosensitive resin for the light-shielding layer 410 there can be used, for instance, a pigment dispersion-type black resist for color filters by Tokyo Ohka Kogyo Co., Ltd. The plan-view pattern of the light-shielding layer 410 is identical to that of the edge cover 240 of Example 1 (see, FIGS. 3 and 4), having an opening for each column made up of the pixel regions 140R, 140G, 140B. The pitch of the pixel regions 140R, 140G, 140B is identical to that of Example 1.

Next, the partition 120 was formed, in the same way as in Example 1, on the light-shielding layer 410, to a height of 20 μm and a width of 20 μm, and the frame-like structures 110a, 110b, 110c were formed to a height of 20 μm and a width of 20 μm.

The pattern and size of the partition 120 and the frame-like structures 110a, 110b, 110c are identical to those of Example 1. Appropriate patterns and sizes for the partition 120 and the frame-like structures 110a, 110b, 110c in the present example can be set in the same way as in Example 1.

In the substrate formed as described above, the surface of the substrate 400 was exposed next to UV ozone for 2 minutes, to impart lyophilicity to the openings of the pixel regions 140R, 140G, 140B, and to the surfaces of the light-shielding layer 410, the partition 120 and the frame-like structures 110a, 110b, 110c.

As a result of the above treatment the contact angle between water and the openings of the pixel regions 140R, 140G, 140B, the light-shielding layer 410 and the partition 120 was set to 30° or less. The contact angle between the frame-like structures 110a, 110b, 110c in FIG. 3 and water was likewise set to 30° or less.

Next, in the same way as in Example 1, a coating liquid containing a material of the colored layer 420R (filling liquid 130a in FIG. 3) was filled from the frame-like structure 110a into the pixel region 140R. Similarly, a coating liquid containing a material of the colored layer 420G (filling liquid 130b of FIG. 3) was filled from the frame-like structure 110b into the pixel region 140G. Likewise, a coating liquid containing a material of the colored layer 420B (filling liquid 130c of FIG. 3) was filled from the frame-like structure 110c into the pixel regions 140B. Thereafter, the colored layers 420R, 420G, 420B were formed through a drying step. More specifically, the coating liquids used were solutions resulting from dispersing, in methyl carbitol, color pigments of the respective colors, to a weight concentration of about 10%. After filling the pixel regions 140R, 140G, 140B with the respective coating liquids, the substrate 400 was dried for 60 minutes at 200° C. in vacuum of 1 Pa or less, to dry off the solvent component in the R, G and B solutions (coating liquids), and form as a result the colored layers 420R, 420G, 420B. The film thickness of all the colored layers 420R, 420G, 420B was set to about 2 μm.

Thereafter, the planarizing layer 430 was formed on the partition 120 and the colored layers 420R, 420G, 420B. As the material of the planarizing layer 430 there can be used, for instance, a transparent planarizing material for LCDs by Tokyo Ohka Kogyo Co., Ltd. The solution comprising the material of the planarizing layer 430 was coated, using a slot coater, from above the partition 120, to a film thickness of 1 μm. The planarizing layer 430 was then formed through baking for 60 minutes at 200° C. in a nitrogen atmosphere.

Lastly, a transparent conductive film comprising ITO was formed, as the electrode 440, at desired positions alone, by sputtering using a mask. The film thickness of the transparent conductive film comprising ITO was set to 100 nm.

In addition to the above-described configuration of the present example, and although not shown in the figures, a photo spacer for restricting the thickness (inter-electrode distance) of a liquid crystal cell can be formed on the electrode 440, and also a structure for modifying the thickness of the liquid crystal cell, depending on the region, can be further formed on the planarizing layer 430.

Figure 11:
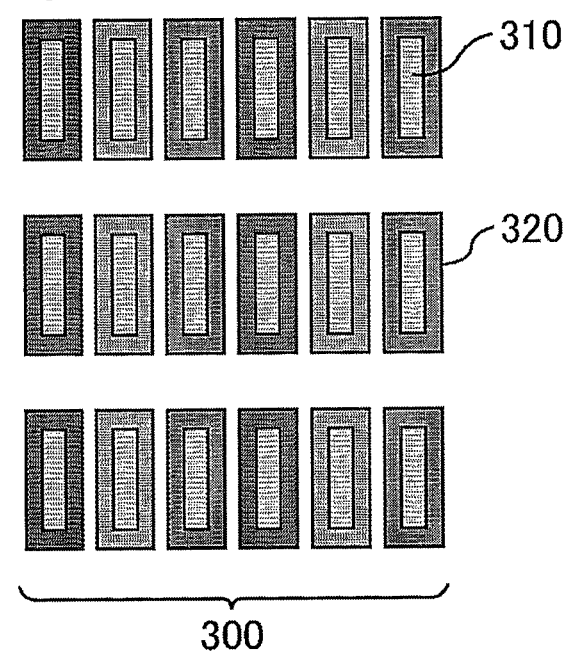
FIG. 11 is a plan-view schematic diagram illustrating the configuration of a conventional organic EL display device.

In the color filter substrate 100 manufactured according to a procedure such as the above-described one, the colored layers 420R, 420G, 420B are formed in accordance with a method of filling (coating) a coating liquid by capillarity afforded by the frame-like structures 110a, 110b, 110c. Therefore, a color filter substrate free of mixed colors can be manufactured in a simple manner. Further, in a case where an ink-jet method is employed for all the colors of the pixel regions 140R, 140G, 140B, as illustrated in FIG. 11, not only was it necessary to subject a substrate to a complex lyophilizing-lyophobizing treatment in such a manner that respective solutions accumulate at the pixel regions 140R, 140G, 140B, but it was also necessary to use an ink-jet device having high-precision discharge positioning capability for all the colors. Coating time was thus longer, which was likely to result in decreased throughput. In the present example, however, the colored layers 420R, 420G, 420B are formed through filling (coating) by capillarity. Therefore, the device used for forming the colored layers 420R, 420G, 420B need only have the capability of discharging the coating liquids into the frame-like structures 110a, 110b, 110c. No high-precision discharge-positioning capability is thus required for forming the colored layers 420R, 420G, 420B. Likewise, there need be used no high-performance ink-jet device having discharge heads for all the colors.

In a case where photolithography is used for all the colors of the pixel regions 140R, 140G, 140B, as illustrated in FIG. 11, it is necessary to remove unwanted portions, from among the colored layers 420R, 420G, 420B, by exposure and development, every time that one color is formed. The material use efficiency is accordingly poor. Also, photolithography must be carried out for each color of the colored layers 420R, 420G, 420B (three times in the case of the present example). This entails a longer takt time of the process of forming the colored layers 420R, 420G, 420B. In the method of the present example, however, it is sufficient for the coating liquid to be filled (coated) just at a desired position. Accordingly, material use efficiency is high, and filling (coating) can be performed simultaneously for all the colors of the colored layers 420R, 420G, 420B. It becomes possible therefore to curb increases in the takt time of the process for forming the colored layers 420R, 420G, 420B.

Needless to say, the methods described in Examples 2 to 5 can be used also in a color filter substrate such as the one of the present example.

In Examples 1 to 6, a coating liquid fills the pixel regions 140R, 140G, 140B by exploiting the flow of the coating liquids on account of capillarity. So long as there is flow of the coating liquid, however, capillarity is not a necessary requirement.

The features of the embodiments and examples can be suitably combined with each other without departing from the scope of the present invention.

The present application claims priority to Patent Application No. 2009-129516 filed in Japan on May 28, 2009 under the Paris Convention and provisions of national law in a designated State, the entire contents of which are hereby incorporated by reference.

EXPLANATION OF THE REFERENCE NUMERALS

100: organic EL display device or color filter substrate
110a, 110b, 110c, 110c1, 110c2, 110d1, 110d2: frame-like structure
120: partition
130a, 130b, 130c: filling liquid
140R: R pixel region
140G: G pixel region
140B: B pixel region
150: display area
160: desiccant
170: sealing glass
180: sealing resin (sealing material)
200: TFT substrate
210: interlayer dielectric
220: hole-injection layer and hole-transport layer (hole-injection layer-cum-hole-transport layer)
230R: R organic emissive layer
230G: G organic emissive layer
230B: B organic emissive layer
240: edge cover
250: first electrode
260: second electrode
270: TFT
300: pixel
310: pixel emissive section
320: vapor deposition region
400: substrate
410: light-shielding layer (BM)
420R: R colored layer
420G: G colored layer
420B: B colored layer
430: planarizing layer
440: electrode

The invention claimed is:
1. An organic electroluminescent display device, comprising:
a substrate in which a plurality of pixel regions, including a pixel region of a first color, a pixel region of a second color and a pixel region of a third color, is disposed within a display area, and
a functional material layer comprising an organic emissive layer being disposed at each of the plurality of pixel regions, wherein, a first partition part, a second partition part, and a third partition part are disposed on the substrate within the display area, a first frame-like structure, a second frame-like structure, and a third frame like structure are disposed on the substrate outside the display area, the first frame-like structure and the second frame-like structure are oppositely disposed across the display area, each of the first frame-like structure and the second frame-like structure is disposed in the form of a rectangle along an end portion of the substrate, the pixel region of the first color is disposed within a first demarcation region demarcated by the first partition part, the pixel region of the second color is disposed within a second demarcation region demarcated by the second partition part, the pixel region of the third color is disposed within a third demarcation region demarcated by the third partition part, the first demarcation region is connected to an interior of the first frame-like structure, the second demarcation region is connected to an interior of the second frame-like structure, the third demarcation region is connected to an interior of the third frame-like structure, the first frame-like structure is provided in the form of a frame in such a manner so as to surround a rectangular region, with the exception of the connection to the first demarcation region, and the second frame-like structure is provided in the form of a frame in such a manner so as to surround a rectangular region, with the exception of the connection to the second demarcation region the third frame-like structure is provided in the form of a frame in such a manner so as to surround a rectangular region, with the exception of the connection to the third demarcation region, in a plan view of the substrate, a plurality of the first demarcation regions and a plurality of the second demarcation regions are alternately juxtaposed on the substrate, and the third demarcation region has a meandering shape along a contour line of the first demarcation region and a contour line of the second demarcation region.

2. The organic electroluminescent display device according to claim 1, wherein, in a plan view of the substrate, the first frame-like structure and the second frame-like structure are oppositely disposed across the display area, and the third frame-like structure is disposed at a region flanked by the first frame-like structure and the second frame-like structure.

3. The organic electroluminescent display device according to claim 1, further comprising at least two structures of the third frame-like structure, wherein, in a plan view of the substrate, the at least two structures of the third frame-like structures are oppositely disposed across the display area.

4. The organic electroluminescent display device according to claim 1, wherein, in a plan view of the substrate, the third demarcation region includes a serpentine shape along a contour line of either the first demarcation region or the second demarcation region.

5. The organic electroluminescent display device according to claim 4, wherein, in a plan view of the substrate, a plurality of pixel regions of the third color is oppositely disposed within the third demarcation region so as to flank either the first demarcation region or the second demarcation region.

6. The organic electroluminescent display device according to claim 1, further comprising a pair of electrodes that sandwich the functional material layer, and an edge cover that covers an end portion of one of the pair of electrodes, on the substrate, wherein at least one of the first partition part, the second partition part and the third partition part is disposed on the edge cover.

7. The organic electroluminescent display device according to claim 1, wherein the substrate is a TFT substrate.

8. The organic electroluminescent display device according to claim 1, wherein a plurality of picture elements, each including the pixel region of the first color, the pixel region of the second color and the pixel region of the third color, is juxtaposed in row and column directions within the display area, and two pixel regions of at least one color, from among the pixel region of the first color, the pixel region of the second color and the pixel region of the third color, are disposed in one picture element.

9. The organic electroluminescent display device according to claim 1, wherein a plurality of picture elements, each including the pixel region of the first color, the pixel region of the second color and the pixel region of the third color, is juxtaposed in row and column directions within the display area, and the pixel region of the first color, the pixel region of the second color and the pixel region of the third color are disposed point-symmetrically in picture elements that are adjacent in the row direction.

10. The organic electroluminescent display device according to claim 1, wherein a material of the functional material layer disposed at the pixel region of the first color is disposed within the first frame-like structure, a material of the functional material layer disposed at the pixel region of the second color is disposed within the second frame-like structure, and a material of the functional material layer disposed at the pixel region of the third color is disposed within the third frame-like structure.

11. The organic electroluminescent display device according to claim 1, wherein a material of the organic emissive layer disposed at the pixel region of the first color is disposed within the first frame-like structure, a material of the organic emissive layer disposed at the pixel region of the second color is disposed within the second frame-like structure, and a material of the organic emissive layer disposed at the pixel region of the third color is disposed within the third frame-like structure.

12. An organic electroluminescent display device manufacturing method being a method for manufacturing the organic electroluminescent display device according to claim 1, the manufacturing method comprising the steps of:
- injecting a first coating liquid, containing a material of the functional material layer that is disposed at the pixel region of the first color, into the first frame-like structure;
- injecting a second coating liquid, containing a material of the functional material layer that is disposed at the pixel region of the second color, into the second frame-like structure; and
- injecting a third coating liquid, containing a material of the functional material layer that is disposed at the pixel region of the third color, into the third frame-like structure.

13. The organic electroluminescent display device manufacturing method according to claim 12,
wherein a viscosity of the third coating liquid is lower than those of the first coating liquid and of the second coating liquid.

14. The organic electroluminescent display device manufacturing method according to claim 12,
further comprising a step of forming simultaneously the first partition part, the second partition part, the third partition part, the first frame-like structure, the second frame-like structure and the third frame-like structure.

15. An organic electroluminescent display device manufacturing method being a method for manufacturing an organic electroluminescent display device that comprises:
- a substrate in which a plurality of pixel regions, including a pixel region of a first color, a pixel region of a second color and a pixel region of a third color, is disposed within a display area, and
- a functional material layer comprising an organic emissive layer being disposed at each of the plurality of pixel regions, the manufacturing method comprising the steps of:
- forming, on the substrate within the display area, a first partition part that demarcates the pixel region of the first color, a second partition part that demarcates the pixel region of the second color, and a third partition part that demarcates the pixel region of the third color;
- forming, on the substrate outside the display area, a first frame-like structure whose interior is connected to a first demarcation region demarcated by the first partition part, a second frame-like structure whose interior is connected to a second demarcation region demarcated by the second partition part, and a third frame-like structure whose interior is connected to a third demarcation region demarcated by the third partition part;
- injecting a first coating liquid, containing a material of the functional material layer that is disposed at the pixel region of the first color, into the first frame-like structure; and
- injecting a second coating liquid, containing a material of the functional material layer that is disposed at the pixel region of the second color, into the second frame-like structure;
- injecting a third coating liquid, containing a material of the functional material layer that is disposed at the pixel region of the third color, into the third frame-like structure;

wherein the first frame-like structure and the second frame-like structure are oppositely disposed across the display area,
each of the first frame-like structure and the second frame-like structure is disposed in the form of a rectangle along an end portion of the substrate,
the first frame-like structure is provided in the form of a frame in such a manner so as to surround a rectangular region, with the exception of the connection to the first demarcation region,
the second frame-like structure is provided in the form of a frame in such a manner so as to surround a rectangular region, with the exception of the connection to the second demarcation region,
the third frame-like structure is provided in the form of a frame in such a manner so as to surround a rectangular region, with the exception of the connection to the third demarcation region,
in a plan view of the substrate,
a plurality of the first demarcation regions and a plurality of the second demarcation regions are alternately juxtaposed on the substrate, and
the third demarcation region has a meandering shape along a contour line of the first demarcation region and a contour line of the second demarcation region.

16. A color filter substrate comprising a substrate in which a plurality of colored layers, including a colored layer of a first color, a colored layer of a second color and a colored layer of a third color, is disposed within a display area,
wherein a first partition part, a second partition part, and a third partition part are disposed on the substrate within the display area,
a first frame-like structure and a second frame-like structure, and a third frame-like structure are disposed on the substrate outside the display area and oppositely disposed across the display area,
each of the first frame-like structure and the second frame-like structure is disposed in the form of a rectangle along an end portion of the substrate,
the colored layer of the first color is disposed within a first demarcation region demarcated by the first partition part,
the colored layer of the second color is disposed within a second demarcation region demarcated by the second partition part,
the colored layer of the third color is disposed within a third demarcation region demarcated by the third partition part,
the first demarcation region is connected to an interior of the first frame-like structure,
the second demarcation region is connected to an interior of the second frame-like structure,
the third demarcation region is connected to an interior of the third frame-like structure,
the first frame-like structure is provided in the form of a frame in such a manner so as to surround a rectangular region, with the exception of the connection to the first demarcation region,
the second frame-like structure is provided in the form of a frame in such a manner so as to surround a rectangular region, with the exception of the connection to the second demarcation region,
the third frame-like structure is provided in the form of a frame in such a manner so as to surround a rectangular region, with the exception of the connection to the third demarcation region,
in a plan view of the substrate,
a plurality of the first demarcation regions and a plurality of the second demarcation regions are alternately juxtaposed on the substrate, and
the third demarcation region has a meandering shape along a contour line of the first demarcation region and a contour line of the second demarcation region.

17. A color filter substrate manufacturing method being a method for manufacturing a color filter substrate that comprises a substrate in which a plurality of colored layers, including a colored layer of a first color, a colored layer of a second color and a colored layer of a third color, is disposed within a display area, the manufacturing method comprising the steps of:

forming, on the substrate within the display area, a first partition part that demarcates the colored layer of the first color, a second partition part that demarcates the colored layer of the second color, a third partition part that demarcates the colored layer of the third color;

forming, on the substrate outside the display area, a first frame-like structure whose interior is connected to a first demarcation region demarcated by the first partition part, a second frame-like structure whose interior is connected to a second demarcation region demarcated by the second partition part, and a third frame-like structure whose interior is connected to a third demarcation region demarcated by the third partition part;

injecting a first coating liquid, containing a material of the colored layer of the first color, into the first frame-like structure; and injecting a second coating liquid, containing a material of the colored layer of the second color, into the second frame-like structure, injecting a third coating liquid, containing a material of the colored layer of the third color, into the third frame-like structure, wherein the first frame-like structure and the second frame-like structure are oppositely disposed across the display area, each of the first frame-like structure and the second frame-like structure is disposed in the form of a rectangle along an end portion of the substrate, the first frame-like structure is provided in the form of a frame in such a manner so as to surround a rectangular region, with the exception of the connection to the first demarcation region, the second frame-like structure is provided in the form of a frame in such a manner so as to surround a rectangular region, with the exception of the connection to the second demarcation region the third frame-like structure is provided in the form of a frame in such a manner so as to surround a rectangular region, with the exception of the connection to the third demarcation region, in a plan view of the substrate, a plurality of the first demarcation regions and a plurality of the second demarcation regions are alternately juxtaposed on the substrate, and the third demarcation region has a meandering shape along a contour line of the first demarcation region and a contour line of the second demarcation region.

* * * * *